(12) United States Patent
Hayasaka et al.

(10) Patent No.: US 7,829,975 B2
(45) Date of Patent: Nov. 9, 2010

(54) MULTICHIP SEMICONDUCTOR DEVICE, CHIP THEREFOR AND METHOD OF FORMATION THEREOF

(75) Inventors: Nobuo Hayasaka, Yokosuka (JP);
Katsuya Okumura, Yokohama (JP);
Keiichi Sasaki, Yokohama (JP); Mie Matsuo, Kamakura (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 216 days.

(21) Appl. No.: 11/980,641

(22) Filed: Oct. 31, 2007

(65) Prior Publication Data
US 2008/0237888 A1    Oct. 2, 2008

Related U.S. Application Data

(60) Continuation of application No. 10/902,391, filed on Jul. 30, 2004, now Pat. No. 7,335,517, which is a division of application No. 09/377,486, filed on Aug. 20, 1999, now Pat. No. 6,809,421, which is a continuation-in-part of application No. 08/980,873, filed on Dec. 1, 1997, now abandoned.

(30) Foreign Application Priority Data

Dec. 2, 1996   (JP) ................................ 8-321931
Nov. 7, 1997   (JP) ................................ 9-305784
Oct. 1, 1998   (JP) ............................... 10-280225

(51) Int. Cl.
*H01L 29/40* (2006.01)
(52) U.S. Cl. ............... 257/621; 257/777; 257/686; 257/723; 257/737; 257/738; 257/758; 257/774; 257/778; 257/780

(58) Field of Classification Search ................ 257/621
See application file for complete search history.

(56) References Cited

U.S. PATENT DOCUMENTS 4,499,655 A    2/1985    Anthony (Continued)

FOREIGN PATENT DOCUMENTS

JP           60-7148           1/1985

(Continued)

OTHER PUBLICATIONS

Notification of Reasons for Rejection issued by the Japanese Patent Office on May 8, 2007, for Japanese Patent Application No. 2004-119405, and English-language translation thereof.

(Continued)

*Primary Examiner*—David E Graybill
(74) *Attorney, Agent, or Firm*—Finnegan, Henderson, Farabow, Garrett & Dunner, L.L.P.

(57) ABSTRACT

A multichip semiconductor device is disclosed in which chips are stacked each of which comprises a semiconductor substrate formed on top with circuit components and an interlayer insulating film formed on the top of the semiconductor substrate. At least one of the chips has a connect plug of a metal formed in a through hole that passes through the semiconductor substrate and the interlayer insulating film. The chip with the connect plug is electrically connected with another chip by that connect plug.

5 Claims, 21 Drawing Sheets

U.S. PATENT DOCUMENTS

| | | | |
|---|---|---|---|
| 4,612,083 A * | 9/1986 | Yasumoto et al. | 438/59 |
| 4,712,721 A * | 12/1987 | Noel et al. | 228/56.3 |
| 4,774,632 A | 9/1988 | Neugebauer | |
| 4,807,021 A | 2/1989 | Okumura | |
| 4,978,639 A * | 12/1990 | Hua et al. | 438/465 |
| 5,016,138 A * | 5/1991 | Woodman | 361/688 |
| 5,166,097 A | 11/1992 | Tanielian | 438/667 |
| 5,212,115 A * | 5/1993 | Cho et al. | 438/51 |
| 5,229,647 A | 7/1993 | Gnadinger | |
| 5,260,169 A * | 11/1993 | Nakano | 430/314 |
| 5,268,326 A * | 12/1993 | Lesk et al. | 438/406 |
| 5,270,261 A | 12/1993 | Bertin et al. | |
| 5,399,898 A | 3/1995 | Rostoker | |
| 5,408,123 A | 4/1995 | Murai | |
| 5,411,918 A * | 5/1995 | Keible et al. | 257/737 |
| 5,419,806 A * | 5/1995 | Huebner | 216/20 |
| 5,420,064 A * | 5/1995 | Okonogi et al. | 438/406 |
| 5,445,988 A * | 8/1995 | Schwalke | 438/432 |
| 5,587,342 A * | 12/1996 | Lin et al. | 438/125 |
| 5,608,264 A * | 3/1997 | Gaul | 257/734 |
| 5,618,752 A * | 4/1997 | Gaul | 438/626 |
| 5,627,106 A * | 5/1997 | Hsu | 438/459 |
| 5,646,067 A * | 7/1997 | Gaul | 438/458 |
| 5,648,684 A * | 7/1997 | Bertin et al. | 257/685 |
| 5,682,062 A * | 10/1997 | Gaul | 257/686 |
| 5,702,982 A * | 12/1997 | Lee et al. | 438/620 |
| 5,756,395 A * | 5/1998 | Rostoker et al. | 438/622 |
| 5,757,445 A * | 5/1998 | Vu et al. | 349/45 |
| 5,767,001 A * | 6/1998 | Bertagnolli et al. | 438/455 |
| 5,786,270 A * | 7/1998 | Gorrell et al. | 438/613 |
| 5,793,105 A | 8/1998 | Pace | |
| 5,807,783 A * | 9/1998 | Gaul et al. | 438/406 |
| 5,814,889 A * | 9/1998 | Gaul | 257/773 |
| 5,846,879 A | 12/1998 | Winnerl et al. | |
| 5,851,894 A * | 12/1998 | Ramm | 438/311 |
| 5,930,596 A * | 7/1999 | Klose et al. | 438/98 |
| 5,973,396 A * | 10/1999 | Farnworth | 257/698 |
| 5,976,769 A * | 11/1999 | Chapman | 430/316 |
| 6,599,778 B2 | 7/2003 | Pogge et al. | 438/118 |
| 6,608,371 B2 | 8/2003 | Kurashima et al. | 257/686 |
| 6,639,303 B2 * | 10/2003 | Siniaguine | 257/621 |
| 6,664,129 B2 * | 12/2003 | Siniaguine | 438/107 |
| 6,740,582 B2 * | 5/2004 | Siniaguine | 438/637 |
| 6,809,421 B1 * | 10/2004 | Hayasaka et al. | 257/777 |
| 6,815,827 B2 * | 11/2004 | Vieux-Rochaz et al. | 257/775 |
| 6,841,849 B2 * | 1/2005 | Miyazawa | 257/621 |
| 6,875,672 B2 * | 4/2005 | Nemoto et al. | 438/458 |
| 6,882,030 B2 * | 4/2005 | Siniaguine | 257/621 |
| 7,005,324 B2 * | 2/2006 | Imai | 438/113 |
| 7,029,937 B2 * | 4/2006 | Miyazawa | 438/40 |
| 7,176,128 B2 * | 2/2007 | Ahrens et al. | 438/643 |
| 7,193,297 B2 * | 3/2007 | Yamaguchi | 257/621 |
| 7,214,615 B2 * | 5/2007 | Miyazawa | 438/667 |
| 2005/0014311 A1 * | 1/2005 | Hayasaka et al. | 438/109 |

FOREIGN PATENT DOCUMENTS

| | | | |
|---|---|---|---|
| JP | 60-7149 | | 1/1985 |
| JP | 60007148 A | * | 1/1985 |
| JP | 60007149 A | * | 1/1985 |
| JP | 60-98654 | | 6/1985 |
| JP | 60-98655 | | 6/1985 |
| JP | 60098654 A | * | 6/1985 |
| JP | 60098655 A | * | 6/1985 |
| JP | 60-160645 | | 8/1985 |
| JP | 60160645 A | * | 8/1985 |
| JP | 62-215264 | | 9/1987 |
| JP | 62215264 A | * | 9/1987 |
| JP | 63-181373 | | 7/1988 |
| JP | 1-98253 | | 4/1989 |
| JP | 1-1161850 | | 6/1989 |
| JP | 01161850 A | * | 6/1989 |
| JP | 4-53271 | | 2/1992 |
| JP | 5-48001 | | 2/1993 |
| JP | 5-63137 | | 3/1993 |
| JP | 7-506936 | | 7/1995 |
| JP | 8-30920 | | 2/1996 |
| JP | 08030920 A | * | 2/1996 |
| JP | 8-330686 | | 12/1996 |
| JP | 10-223833 | | 8/1998 |
| JP | 11-40935 | | 2/1999 |
| JP | 11040935 A | * | 2/1999 |

OTHER PUBLICATIONS

Final Notice of Rejection issued by the Japanese Patent Office on Mar. 6, 2007, for Japanese Patent Application No. 1997-305784, and English-language translation thereof.

Notifiction of Reasons for Rejection issued by the Japanese Patent Office for Japanese Patent Application No. 9-305784, and English translation thereof.

Notice of Reasons for Rejection from the Japanese Patent Office mailed on Dec. 1, 2009, in co-pending application 2007-122807 and English language translation thereof.

* cited by examiner

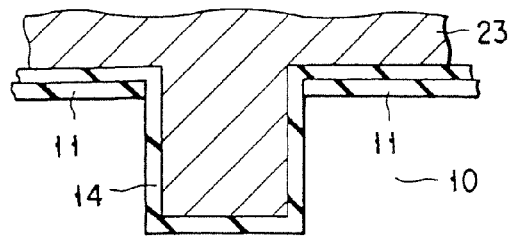
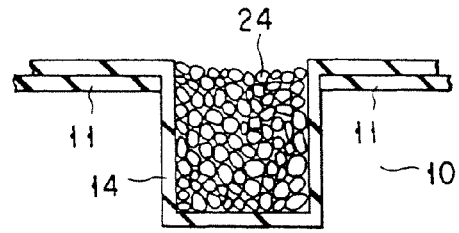
FIG. 12A  FIG. 12B
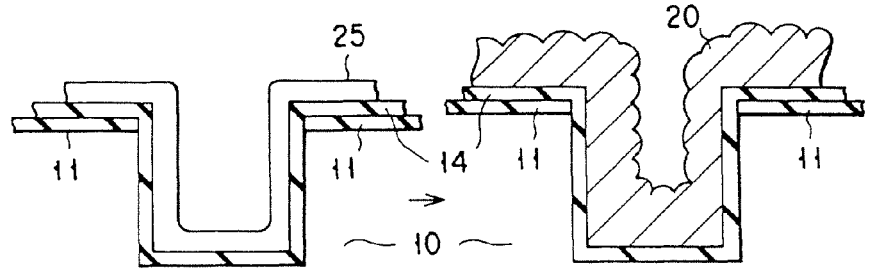
FIG. 12C
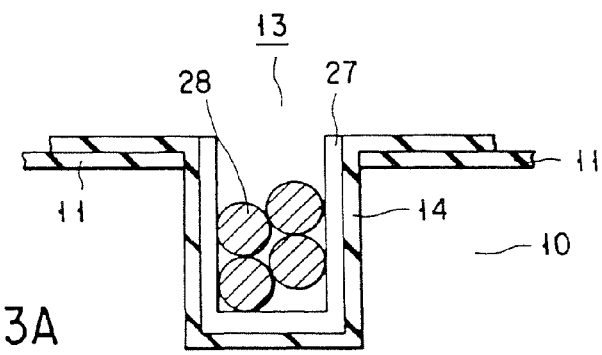
FIG. 13A
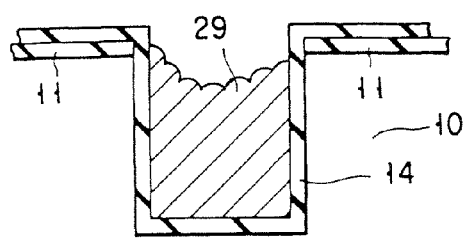
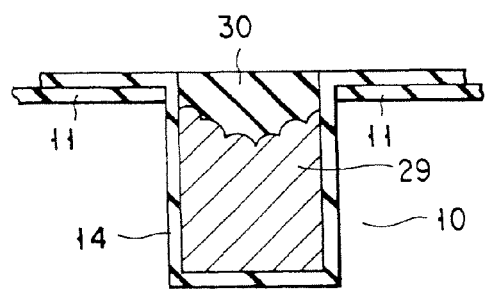
FIG. 13B  FIG. 13C

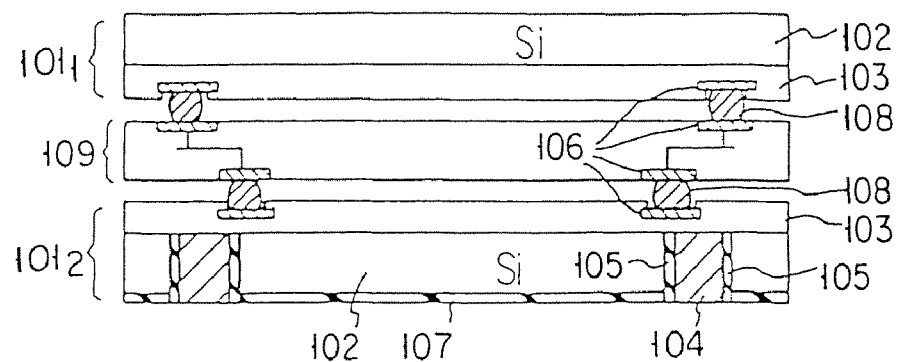
F I G. 25
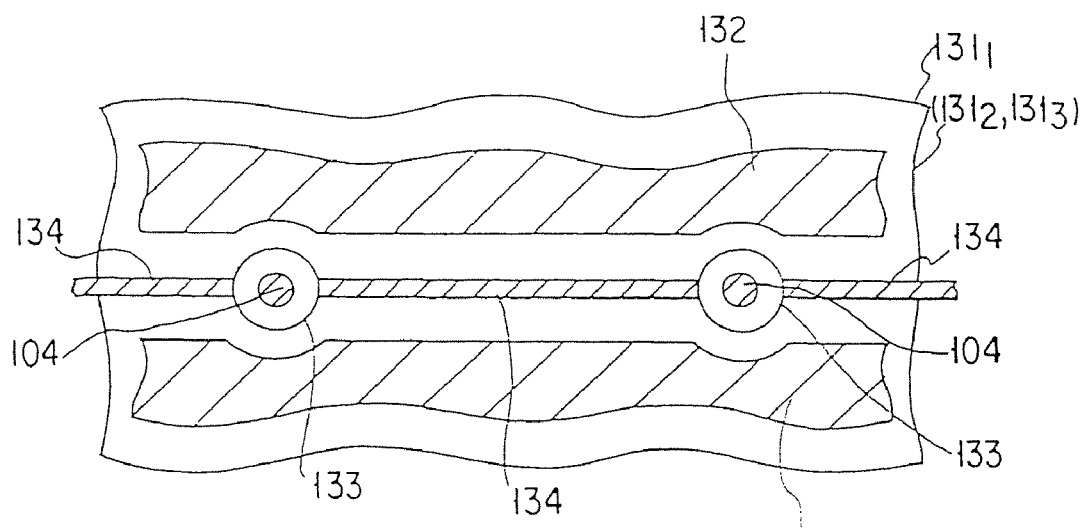
F I G. 27

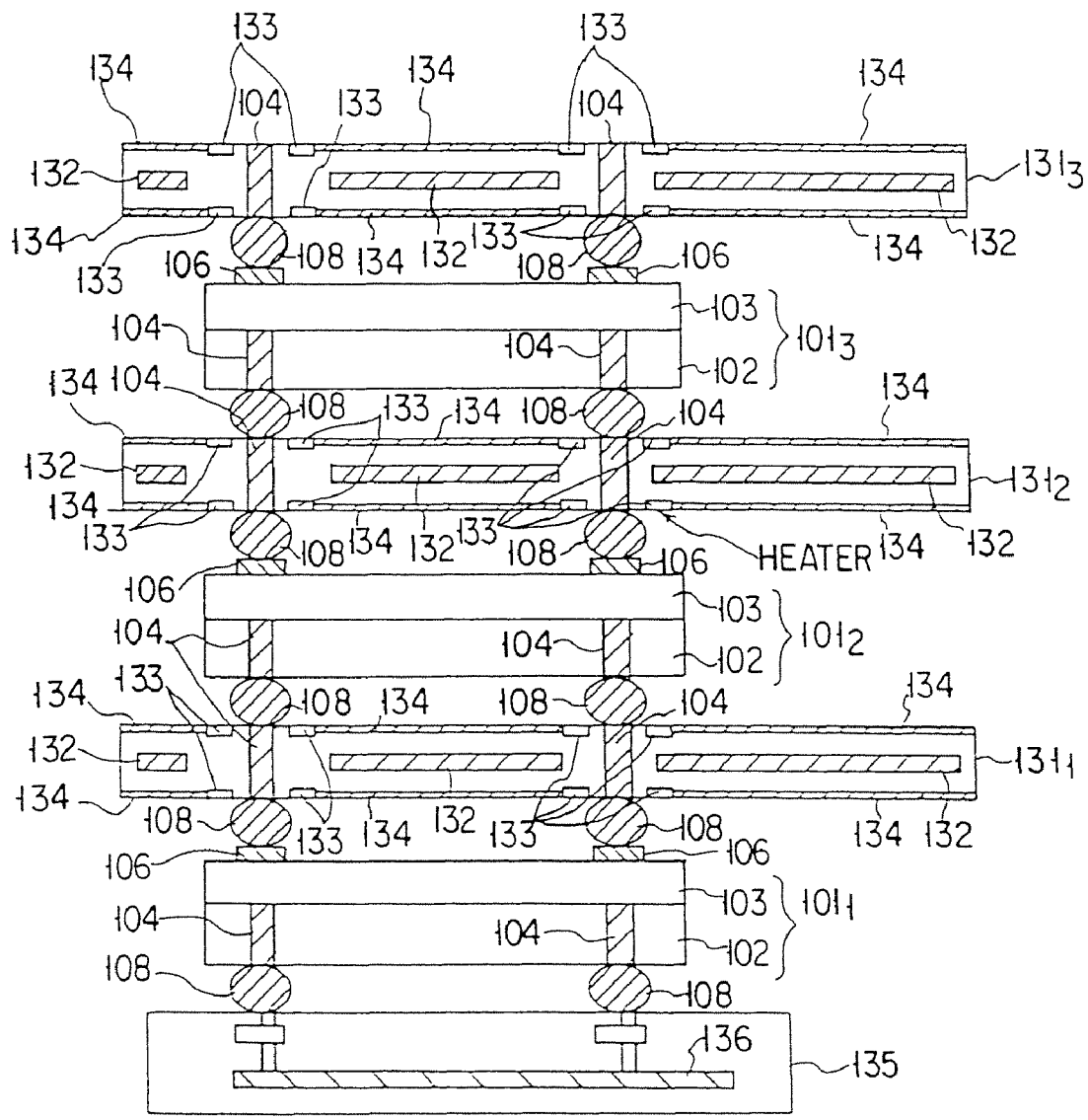
F I G. 26

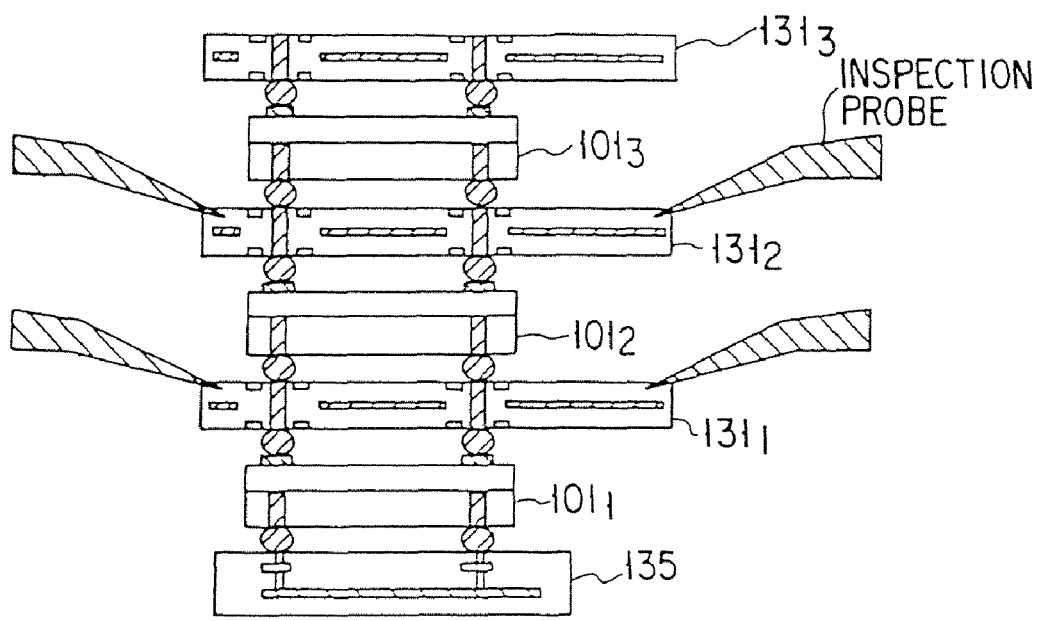
F I G. 28A
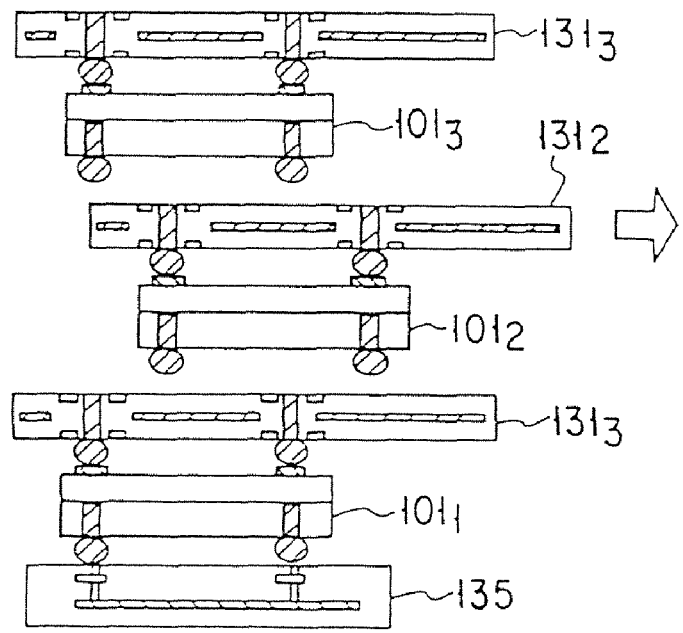
F I G. 28B

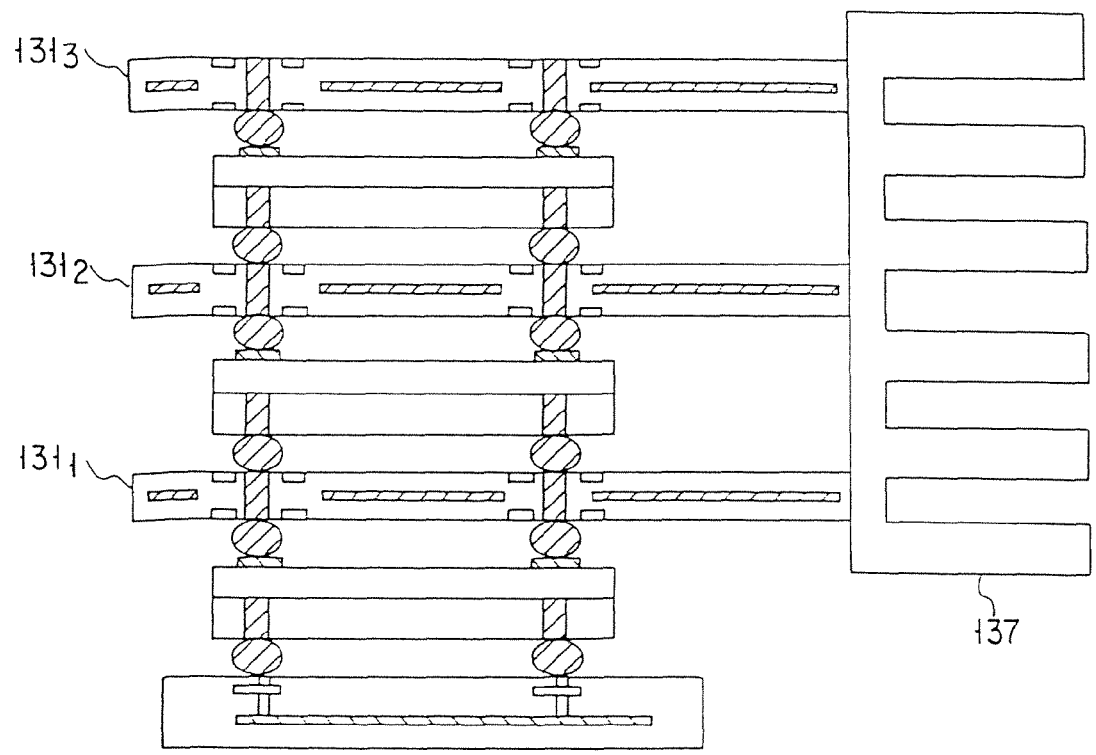
F I G. 29
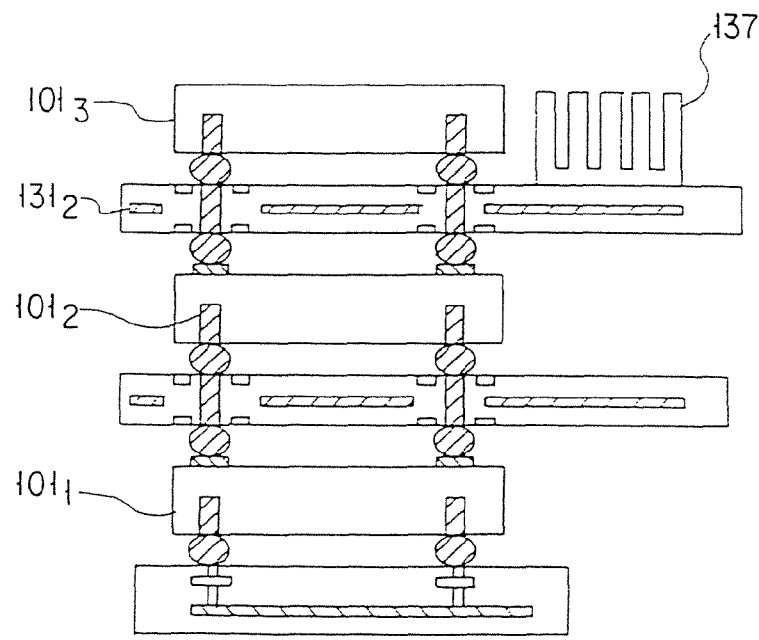
F I G. 30

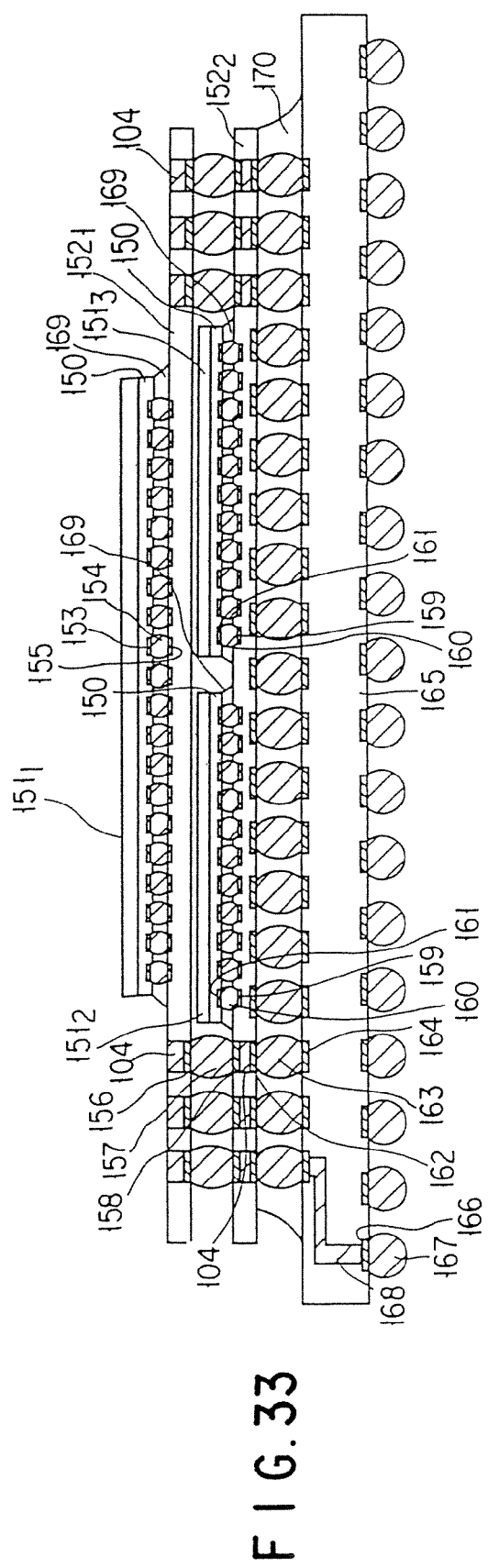
F I G. 33
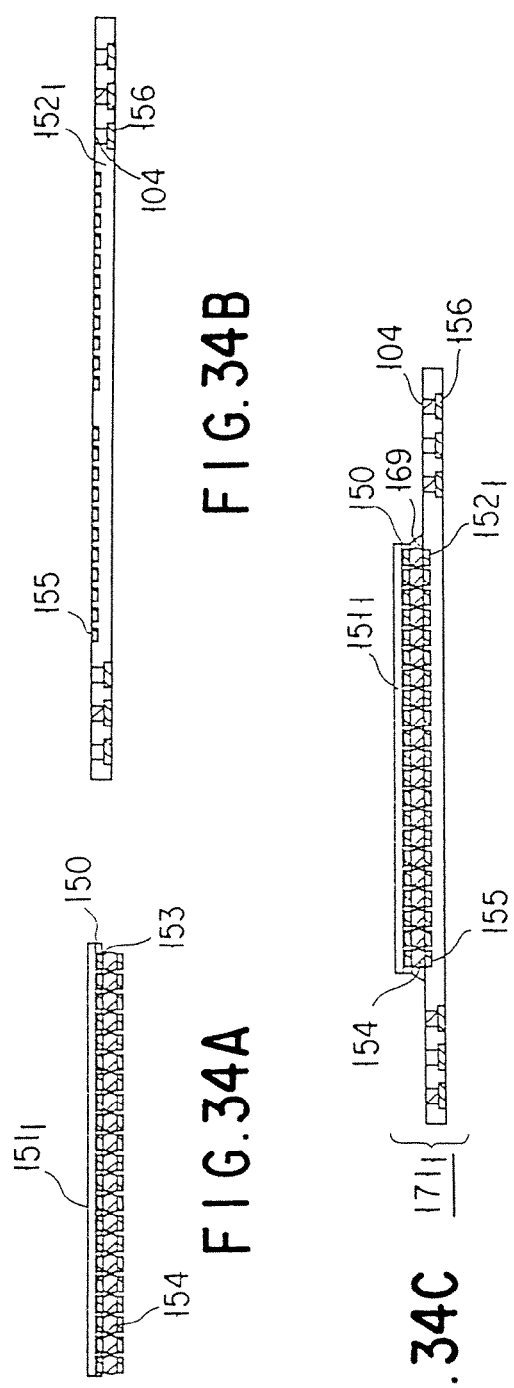
F I G. 34A
F I G. 34B
F I G. 34C

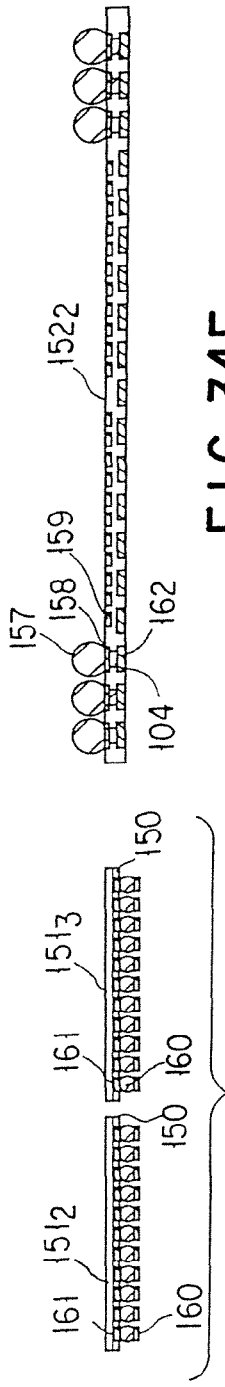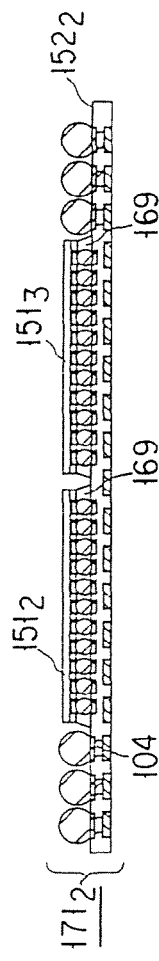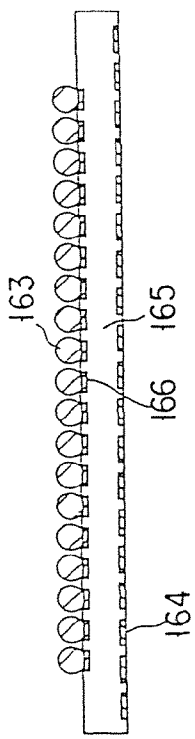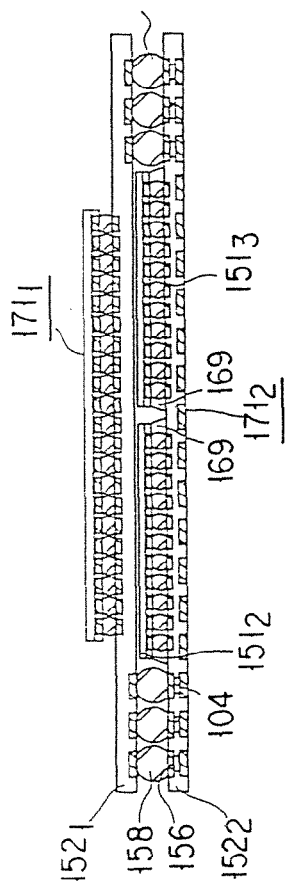

| MATERIAL | THERMAL CONDUCTIVITY (Wm$^{-1}$K$^{-1}$) | LIMEAR EXPANSIVITY (10$^{-6}$) |
|---|---|---|
| SILICON (Si) | 150 | 2.5 |
| GALLIUM ARSENIDE (Ga As) | 50 | 5.8 |
| SILICON DIOXIDE (Si O$_2$) | 1 | 0.5 |
| SILICON NITRIDE (Si$_3$ N$_4$) | 2.3 | 1.5 |
| BERYLLIA (Be O) | 200 | 6.0 |
| ALUMINA (Al$_2$ O$_3$) | 30 | 6.0 |
| SILICON CARBIDE (Si O) | 220 | 3.7 |
| ALUMINUM NITRIDE (AlN) | 230 | 4.3 |
| POLYIMIDE | 0.4 | 45.0 |
| EPOXY GLASS (PRINT BOARD) | 0.3 | 15.0 |

FIG. 35

MULTICHIP SEMICONDUCTOR DEVICE, CHIP THEREFOR AND METHOD OF FORMATION THEREOF

CROSS-REFERENCE TO RELATED APPLICATIONS

This is a continuation application of application Ser. No. 10/902,391, filed Jul. 30, 2004, now U.S. Pat. No. 7,335,517 which is a divisional application of application Ser. No. 09/377,486, filed Aug. 20, 1999 (that issued as U.S. Pat. No. 6,809,421, on Oct. 26, 2004), which is a Continuation-in-Part application of U.S. patent application Ser. No. 08/980,873, filed Dec. 1, 1997, (abandoned); and which claims the benefit and priority to prior Japanese Application Nos. 8-321931 , 9-305784 and 10-280225, filed on Dec. 12, 1996, Nov. 7, 1997 and Oct. 1, 1998, respectively, all of which are incorporated herein by reference.

BACKGROUND OF THE INVENTION

The present invention relates to a multichip semiconductor device using multiple chips.

The present invention also relates to a chip for a multichip semiconductor device and a method of manufacture thereof.

Recent computers and communication equipment use for their important section a large-scale integrated circuit (chip) which has a great number of electronic components, such as transistors, resistors, etc., integrated into a semiconductor substrate. Thus, the performance of the entire equipment depends largely on the performance of the chip.

On the other hand, so-called multichip semiconductor devices have proposed, each having a plurality of chips to improve the whole performance of the equipment. FIGS. 1, 2 and 3 are sectional views of conventional multichip semiconductor devices.

FIG. 1 shows a multichip semiconductor device of a type in which a plurality of chips 82 are placed side by side on a multilayered interconnection substrate 81. Reference numeral 83 denotes a solder bump.

FIG. 2 shows a multichip semiconductor device of a type in which chips are connected together with their major surfaces opposed to each other. FIG. 3 shows a multichip semiconductor device of a type in which a plurality of chips 82 are stacked using stacking plates 84.

However, these conventional multichip semi-conductor devices have the following problems.

In the multichip semiconductor device shown in FIG. 1, the plane area of the device increases because the chips 82 are arranged in the same plane.

The conventional semiconductor device of FIG. 2 is free of the problem with the device of FIG. 1 that the plane area of the device increases. This is because the chips 82 are stacked one above another. However, the device of FIG. 2 has a problem that the number of chips that can be stacked is limited to two. In addition, it is difficult to electrically test each chip.

The conventional semiconductor device of FIG. 3 does not suffer from the problems with the conventional semiconductor devices of FIGS. 1 and 2. However, its structure is complex, its thickness is great, and its manufacturing cost is high. This is because a stacking plate 84 need to be provided between any two adjacent two chip.

BRIEF SUMMARY OF THE INVENTION

It is therefore an object of the present invention to provide a multichip semiconductor device which has a small plane area, a simple structure, and a small thickness.

It is another object of the present invention to provide a chip which makes it possible to implement such a multichip semiconductor device and to provide a method of manufacturing the chip.

According to a first aspect of the present invention, there is provided a multichip semiconductor device having a stack of chips each having a semi-conductor substrate which has a surface on which circuit components are formed and an interlayer insulating film formed on the surface of the semi-conductor substrate, wherein at least one chip of the chips has a connect plug formed in a through hole which passes through the semiconductor substrate and a part of the interlayer insulating film, and the one chip having the connect plug is electrically connected with a another chip of the chips by the connect plug.

For example, the interlayer insulating film is a interlayer insulating film of a first layer covered with the circuit component.

According to a second aspect of the invention, there is provided a multiple semiconductor device according to the first aspect, in which the another chip has a connect member that electrically connects with the connect plug, and the connect member is, for example, a metal bump.

According to third aspect of the invention, there is provided a multiple semiconductor device according to the first aspect, wherein the one chip and the another chip are electrically connected with each other through a packing member. The packing member is an interconnecting substrate or TAB tape.

According to a fourth aspect of the present invention, there is provided a chip for use in a multichip semiconductor device, comprising:

a semiconductor substrate having a surface on which circuit components are formed;

an interlayer insulating film formed on the surface of the semiconductor substrate; and a connect plug made of a metal formed in a through hole that passes through a part of the interlayer insulating film and the semiconductor substrate and adapted to provide an electrical connection for another chip.

According to a fifth aspect of the invention, there is provided a chip according to the fourth aspect, wherein the connect plug comprises a metal plug formed in the through hole and an insulating film formed between the metal plug and a sidewall of the through hole.

According to a sixth aspect of the present invention, there is provided a chip according to the fourth aspect, wherein the connect plug comprises a metal plug formed in the through hole and having a cavity, an insulating film formed between the metal plug and a sidewall of the through hole, and a low stress film formed in the cavity of the metal plug, the low stress film being smaller than the metal plug in the difference in thermal expansion coefficient from the semiconductor substrate.

According to a seventh aspect of this invention, there is provided a chip according to the fourth aspect, wherein the connect plug comprises a metal plug formed in the through hole so that a space is left in the through hole on the top side of the semiconductor substrate, an insulating film formed between the metal plug and the sidewall of the through hole, and a cap layer formed in the space in the through hole.

According to an eighth aspect of the invention, there is provided a chip according to the fourth aspect, wherein the connect plug comprises a metal plug formed in the through hole so that a space is left in the through hole on the rear side of the semiconductor substrate, an insulating film formed between the metal plug and a sidewall of the through hole, and a connect member formed in the space in the through hole.

The rear side of the semiconductor substrate on the connect member side is preferably coated with an insulating film except the area of the connect member.

According to a ninth aspect of the present invention, there is provided a method of forming a chip for use in a multichip semiconductor device, comprising the steps of:

forming circuit components on a surface of semiconductor substrate;

forming an interlayer insulating film over the major surface of the semiconductor substrate;

selectively etching the interlayer insulating film and the semiconductor substrate to form a hole that passes through the interlayer insulating film but not the semiconductor substrate;

forming an insulating film on the sidewall and bottom of the hole to a thickness that does not fill up the hole;

filling the hole covered with the insulating film with a metal to form a metal plug; and processing a rear side of the semiconductor substrate to thereby expose the metal plug at the bottom of the hole.

According to a tenth aspect of the invention, there is provided a method according to the ninth aspect, wherein the hole is formed prior to the formation of an interconnection layer which, of interconnection layers to be formed above the semiconductor substrate, has the lowest melting point.

According to an eleventh aspect of the present invention, there is provided a method according to the ninth aspect, in which the step of processing the rear side of the semiconductor substrate is performed after the semiconductor substrate has been cut out from a wafer.

According to a twelfth aspect of the present invention, there is provided a method of forming a chip for use in a multichip semiconductor device, comprising the steps of:

manufacturing circuit components on a surface of semiconductor substrate using integrated-circuit techniques;

forming an interlayer insulating film on the surface of the semiconductor substrate;

selectively etching the interlayer insulating film and the semiconductor substrate to form a hole that passes through the interlayer insulating film but not the semiconductor substrate;

forming a first insulating film on a sidewall and bottom of the hole to a thickness that does not fill up the hole;

filling the hole with a second insulating film which has a higher etch rate than the first insulating film;

forming a contact hole in the interlayer insulating film and forming an interconnection layer that connects with the circuit components through the contact hole;

processing a rear side of the semiconductor substrate and the first insulating film in the hole to expose the second insulating film at the bottom of the hole;

etching away the second insulating film in the hole; and filling the hole covered with the first insulating film with a metal to form a metal plug.

According to a thirteenth aspect of the invention, there is provided a method according to the twelfth aspect, in which the rear side of the semiconductor substrate is processed after the semiconductor substrate has been cut out from a wafer.

According to a fourteenth aspect of the present invention, there is provided a method of forming a chip for use in a multichip semiconductor device, comprising the steps of:

manufacturing circuit components on a semi-conductor substrate using integrated-circuit techniques;

forming an interlayer insulating film over a surface of the semiconductor substrate;

selectively etching the interlayer insulating film and the semiconductor substrate to form a hole that passes through the interlayer insulating film but not the semiconductor substrate;

forming a first insulating film on a sidewall and bottom of the hole to a thickness that does not fill up the hole;

filling the hole covered with the first insulating film with a metal to form a metal plug;

process a rear side of the semiconductor substrate to expose the first insulating film at the bottom of the hole;

selectively etching the rear side of the semiconductor substrate until the first insulating film on the sidewall of the hole which is above the first insulating film at the bottom of the hole is exposed;

forming a second insulating film over the entire rear side of the semiconductor substrate; and etching the first and second insulating films until the metal plug at the bottom of the hole is exposed, thereby selectively remaining the second insulating film on the rear side of the semiconductor substrate in the side of the bottom of the hole.

According to a fifteenth aspect of this invention, there is provided a method according to the fourteenth aspect, in which the hole is formed prior to the formation of an interconnection layer which, of interconnection layers to be formed above the semiconductor substrate, has the lowest melting point.

According to a sixteenth aspect of the invention, there is provided a method according to the fourteenth aspect, in which the step of processing the rear side of the semiconductor substrate is performed after the semiconductor substrate has been cut out from a wafer.

According to a seventeenth aspect of the invention, there is provided a semiconductor chip for use in a multichip semiconductor device comprising:

a semiconductor substrate formed on a circuit components;

a first interlayer insulating film formed on the semiconductor substrate;

a second insulating film formed on a sidewall of a through hole that passes through the first insulating film and the semiconductor substrate;

a metal plug that fills up the through hole;

a second interlayer insulating film formed on the first interlayer insulating film;

an interconnection layer formed on the metal plug;

a plug formed on the interconnection layer; and a connect member formed on the plug to provide an electrical connection for another chip.

Unlike the conventional multichip semiconductor device in which a plurality of chips are arranged side by side, the present invention in which a plurality of chips are stacked has no problem that the plane area of the device increases.

Moreover, unlike the conventional multichip semiconductor device in which two chips are connected together with their major surfaces opposed to each other, the multichip semiconductor device of the present invention has no problem that the number of chips to be stacked is limited to two because the chips are connected together by means of the metal plugs that pass through the silicon substrate and the first interlayer insulating film.

Furthermore, unlike the conventional semiconductor device in which chips are stacked with the aid of stacking plates, the semiconductor device of the present invention has no problems of complexity of the structure and increased thickness because no stacking plate is used to connect the chips together.

The present invention can therefore provide a multichip semiconductor device which has a small plane area, a simple structure, and a small thickness.

A chip for use in a multichip semiconductor device of the present invention has a connect plug that is formed in a through hole that passes through the semiconductor substrate and the interlayer insulating film and adapted to provide an electrical connection for another chip.

Therefore, the semiconductor device using such a chip has a small plane area, a simple structure, and a small thickness.

The connect plug has also the effect of radiating heat of the chip. By putting a probe to the connect plug from the rear side of the chip, the device or chip can be tested.

In the present invention, the hole that passes through the semiconductor substrate and the interlayer insulating film is not formed immediately. This is because semiconductor substrates are generally not so thin as to allow the through hole to be formed immediately.

That is, in the present invention, a hole is formed first which passes through the interlayer insulating film but not the semiconductor substrate and then a metal film, serving as the connect plug, is formed in the hole with an insulating film interposed therebetween.

Following such processes, the rear side of the semiconductor substrate and the insulating film are processed until the metal film at the bottom of the hole is exposed, whereby the through hole that passes through the semiconductor substrate and the insulating film is formed. Thus, even if the starting semiconductor substrate is thick, the through hole can be formed easily.

In the present invention, the contact hole is formed in the interlayer insulating film in the state where the hole is filled with the second insulating film having a higher etch rate than the first insulating film and the interconnection layer is formed which connects with the circuit components through the contact hole. After that, the second insulating film is selectively etched away to form the metal film in the hole. Thus, the metal film will not be affected by heat treatment for forming the interconnection layer.

This prevents the degradation of characteristics of the chip due to ingredients of the metal film diffusing into the semiconductor substrate. Unlike the case where a diffusion preventing structure, such as a barrier, is formed so as to prevent the diffusion of the ingredients of the metal film, there is no need for complicated processes.

According to the present invention, the through hole can be formed easily and the exposed surface of the semiconductor substrate on the hole bottom side is coated easily with the second insulating film.

The processing of the rear side of the semiconductor substrate by polishing or etching is preferably performed after the chip has been cut out from a wafer. The reason is that it is difficult to uniformly process the wafer, which is generally large and exhibits low mechanical strength.

According to an 18th aspect of the invention, there is provided a multichip semiconductor device comprising:

chips each having a semiconductor substrate on which devices are integrally formed; and a connecting substrate provided between adjacent two of the chips which are vertically arranged, wherein the vertically adjacent two chips are electrically connected via the connecting substrate, a through-hole is formed in at least one of the semiconductor substrates, and a conductive plug is formed in the through-hole and connected to the connecting substrate.

The through-hole may be provided in either or both of the semiconductor substrates of the two chips.

According to a 19th aspect of the invention, a material of the connecting substrate has higher radiation properties than a material of each chip.

Specifically, in the case of a Si-chip, the connecting substrate is formed of an insulating material such as SiC.

According to 20th aspect of the invention, the connecting substrate comprises:

a connecting substrate body having the conductive plug formed in the through-hole passing through the connecting substrate; and a high-thermal-conductivity member having a higher thermal conductivity than the connecting substrate body.

Specifically, where the connecting substrate is formed of an insulating material such as SiC, the high-thermal-conductivity member is formed of a metallic material such as W or Cu.

According to a 21st aspect of the invention, the high-thermal-conductivity member is a conductive plate formed within the connecting substrate body.

In this case, a conductive plate may be provided on the surface of the connecting substrate. In addition, the conductive plate may be provided both within the connecting substrate and on the surface of the connecting substrate.

According to a 22nd aspect of the invention, the high-thermal-conductivity member is a radiation fin provided on a surface of the connecting substrate body.

The radiation fin may be provided on each of all the connecting substrates, or only on a specific connecting substrate, e.g. a connecting substrate with low radiation properties.

According to a 23rd aspect of the invention, there is provided a multichip semiconductor device comprising:

chips each having a semiconductor substrate on which devices are integrally formed; and a connecting substrate provided between adjacent two of the chips which are vertically arranged, wherein a through-hole is formed in the connecting substrate, and a conductive plug is formed in the through-hole, each of the vertically adjacent two chips is electrically connected to the conductive plug via bumps, and the connecting substrate has heating units for heating the bumps.

According to a 24th aspect of the invention, there is provided a multichip semiconductor device comprising:

chips each having a semiconductor substrate on which devices are integrally formed; and a connecting substrate provided between adjacent two of the chips which are vertically arranged, wherein a through-hole is formed in the connecting substrate, and a conductive plug is formed in the through-hole, the vertically adjacent two chips are electrically connected to each other via the conductive plug, and the connecting substrate is formed of a material having a thermal expansivity substantially equal to a thermal expansivity of each semiconductor substrate.

The advantages of the above-described aspects of the invention will now be described.

According to the 18th aspect of the invention, since a plurality of chips are stacked, the area in plan of the device can be reduced, unlike the conventional multichip semiconductor device in which a plurality of chips are arranged in a plane.

In addition, the chip in which conductive plug is formed may be situated at the top or bottom of the device and thus the test probes can easily be put in contact with the conductive plug. Therefore, inspections of the device can easily be performed.

According to the 20th to 22nd of the invention, the connecting substrate has a sufficiently higher radiation properties than the chip and the heat of the chip can be efficiently radiated to the outside through the connecting substrates. Since the radiation properties of the device are thus improved, deterioration in operational characteristics of the chip and a decrease in life of the chip due to the heat produced in operation of the chip can be prevented.

According to the 23rd aspect of the invention, the bumps connected to a defective chip are melted by heater units of the connecting substrate, and the defective chip can be separated from connecting substrate. Therefore, the repairs of the chip can easily be made. In particular, where the heating units of each connecting substrate can be independently controlled, the repairs of the chip can be made more easily.

According to the 24th aspect of the invention, since the thermal expansivity of the material of the connecting substrate is substantially equal to that of the material of the semiconductor substrate, there is no need to use the adhesive including the filler in order to make their thermal expansivities close to each other.

Accordingly, even if the integration density of the chip further increases and the distance between the connecting substrate and the semiconductor substrate further decreases, there occurs no region which is not filled with the adhesive. Therefore, reliable connection between the chip and the connecting substrate is ensured, and thus reliable connection between the upper and lower chips is ensured.

In the case where the thermal expansivity of the material of the connecting substrate is nearly equal to that of the material of the semiconductor substrate, no thermal strain occurs in the bumps even if the bumps are used to connect the connecting substrate and semiconductor substrate.

Accordingly, even if the integration density of the chip further increases and the distance between the chip and the connecting substrate further decreases, reliable connection between the connecting substrate and the semiconductor substrate is ensured, and thus reliable connection between the upper and lower chips is ensured.

FIG. 35 is a table showing the thermal conductivity and linear expansivity of principal materials of the semiconductor substrate used for chips and the connecting substrate.

In the present invention, if Si is used as material of the semiconductor substrate, Si is optimal as material of the connecting substrate with respect to thermal strain, but silicon carbide (SiC) or aluminum nitride: (AlN) having substantially the same linear expansivity as Si may also be used. Since SiC and AlN have a higher thermal conductivity than Si, these are excellent with respect to radiation properties, too.

If the semiconductor substrate used for the chip is formed of a compound semiconductor, e.g. gallium arsenic such materials as GaAs, beryllia (BeO) and alumina ($Al_2O_3$) are proper for the connecting substrate.

A tolerable difference in thermal expansivity depends on the size and pitch of the connection terminals (pads) and the size of the connecting substrate. In order to ensure reliable connection between the chips, which is aimed at by the invention, it is preferable that the difference between the thermal expansivity of the material of the connecting substrate and the thermal expansivity of the material of the semiconductor substrate is within $\pm 5.0 \times 10^{-6}$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 12A, 12B and 12C are sectional views illustrating other methods of forming a metal plug;

FIGS. 13A, 13B and 13C are sectional views illustrating still another method of forming a metal plug;

FIG. 25 is a sectional view of a multichip semiconductor device according to an eleventh embodiment of the present invention;

FIG. 26 is a sectional view of a multichip semiconductor device according to a 12th embodiment of the present invention;

FIG. 27 is a plan view showing a connecting substrate of the multichip semiconductor device shown in FIG. 26;

FIGS. 28A and 28B show repairing of the multichip semiconductor device of FIG. 26;

FIG. 29 is a sectional view of a multichip semiconductor device according to a 13th embodiment of the present invention;

FIG. 30 is a sectional view of a multichip semiconductor device according to a 14th embodiment of the present invention;

FIG. 33 is a sectional view of a multichip semiconductor device according to a 17th embodiment of the present invention;

FIGS. 34A through 34H are sectional views illustrating a method of forming the multichip semiconductor device shown in FIG. 33; and FIG. 35 is a table showing coefficients of thermal conductivity and linear expansivities of principal materials of semiconductor substrates for chips and connecting substrates.

DETAILED DESCRIPTION OF THE INVENTION

Hereinafter, the preferred embodiments of the present invention will be described with reference to the accompanying drawings.

First Embodiment

Figure 1:
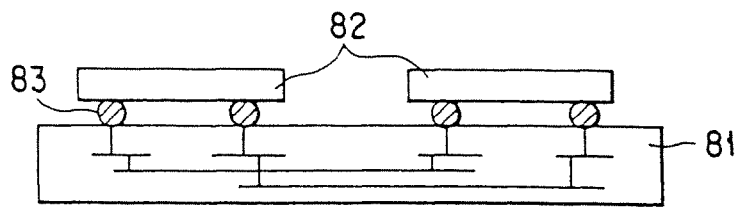
FIG. 1 shows a conventional multichip semi-conductor device.
Figure 2:
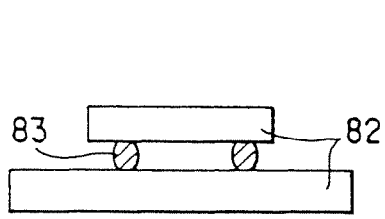
FIG. 2 shows a conventional multichip semi-conductor device.
Figure 3:
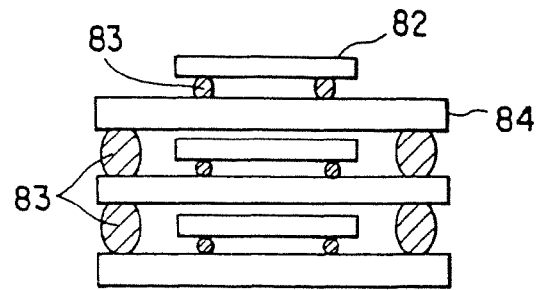
FIG. 3 shows a conventional multichip semi-conductor device.
Figure 4:
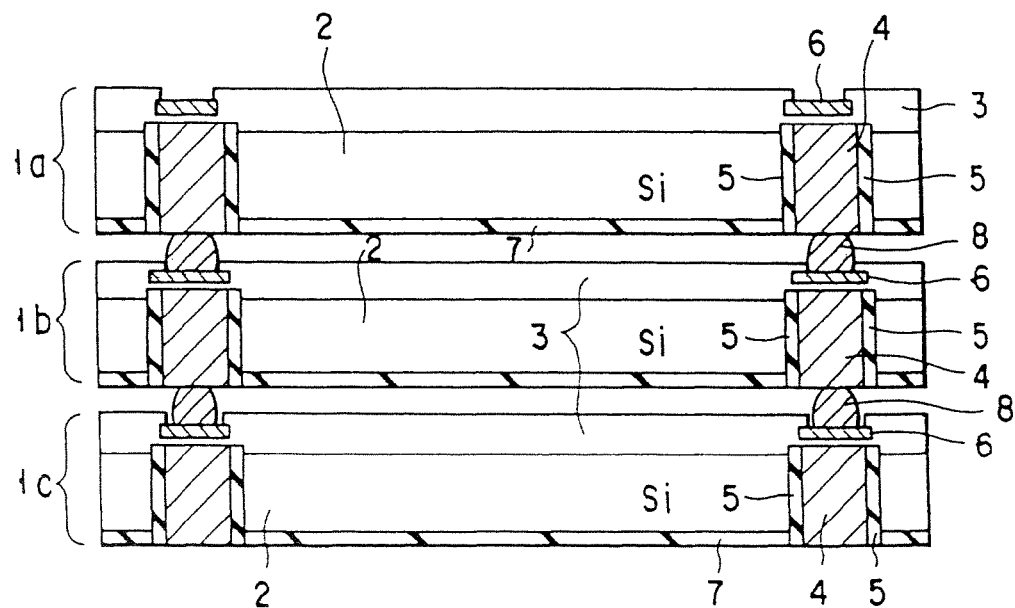
FIG. 4 is a sectional view of a multichip semi-conductor device according to a first embodiment of the present invention.

Referring now to FIG. 4, there is illustrated in section a multichip semiconductor device according to a first embodiment of the present invention.

This multichip semiconductor device is constructed such that three chips $1a$, $1b$ and $1c$ are stacked. Each chip is constructed roughly from a silicon substrate 2 into which circuit devices or components are integrated, a multilevel interconnection layer 3 for inter-connecting the circuit devices in a predetermined relationship, and connect plugs (each with a metal plug 4 and an insulating film 5) formed in through holes that are formed in the silicon substrate 2 and the first insulating film in the multilevel interconnection layer 3 and adapted to electrically connect it with another chip.

The multilevel interconnection layer 3 comprises a first interlayer insulating film that covers the circuit devices, a first interconnection layer that is connected with circuit devices through contact holes (first contact holes) formed in the first interlayer insulating film, a second interlayer insulating film formed over the first interlayer insulating film to cover the first interconnection layer, and a second interconnection layer connected with the first interconnection layer through via holes (second contact holes) formed in the second interlayer insulating film. The multilevel interconnection layer may comprise three or more layers.

The metal plug 4 is formed outside the device formed region. The insulating film 5 is formed between the metal plug 4 and the silicon substrate 2 and between the metal plug and the first interlayer insulating film, that is, between the metal plug and the through hole. The insulating film 5 and the metal plug 4 form a connect plug.

The multilevel interconnection layer 3 of each chip is formed on top with pads 6. The opposite side of the silicon substrate 2 of each chip from the pads 6 is covered with an insulating film 7 except the connect plug areas.

The metal plugs 4 of the chip $1a$ electrically connect through solder bumps 8 with the pads 6 formed on the multilevel interconnection layer 3 of the chip $1b$, thus allowing the chips $1a$ and $1b$ to be electrically connected to each other. Other bumps than solder bumps may be used.

Likewise, the metal plugs 4 of the chip $1b$ electrically connect through solder bumps 8 with the pads 6 formed on the multilevel interconnection layer 3 of the chip $1c$, thus allowing the chips $1b$ and $1c$ to be electrically connected with each other. In this manner, the chips $1a$, $1b$ and $1c$ are electrically connected, with one another.

Unlike the conventional multichip semiconductor device in which multiple chips are placed on the same plane, the multichip semiconductor device of this embodiment has no problem that the plane area of the device increases because the chips $1a$, $1b$ and $1c$ are stacked.

Moreover, unlike the conventional multichip semiconductor device in which two chips are connected together with their major surfaces opposed to each other, the multichip semiconductor device of FIG. 4 has no problem that the number of chips to be stacked is limited to two because the chips are connected together by means of the metal plugs 4 that pass through the silicon substrate 2 and the first interlayer insulating film.

Furthermore, unlike the conventional semiconductor device in which chips are stacked with the aid of plates, the semiconductor device of FIG. 4 has no problems of complexity of the structure and increased thickness because no plate is used to stack the chips.

In addition, the metal plugs 4 has the effect of disposing of unwanted heat.

Further, according to the semiconductor device of FIG. 4, signal delays due to the RC resistance of interconnections between each chip can be prevented because the chips are electrically connected by means of the metal plugs formed in the through holes that pass through the silicon substrate 2 and a part of the first interlayer insulating film.

In addition, according to the semiconductor device of FIG. 4, crosstalk (noise) can be reduced because the chips are electrically connected by means of the metal plugs. Thus, the semiconductor device of FIG. 4 can be advantageously applied to devices with high speed operation and low power dissipation requirements.

According to the present embodiment, therefore, a multichip semiconductor device can be provided which is small in area, simple in structure, small in thickness, and exhibits good heat radiation.

Although the embodiment has been described as comprising three chips, four or more chips can be connected in the same way. Not every chip having the metal plugs 4 need be connected with its neighbor by means of the plugs. That is, one or more of the chips may be formed with metal plugs only for the purpose of heat radiation.

Second Embodiment

Figure 5:
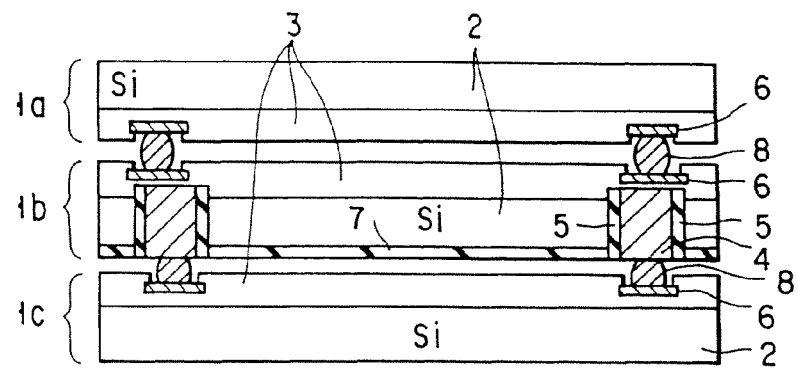
FIG. 5 is a sectional view of a multichip semiconductor device according to a second embodiment of the present invention.

FIG. 5 is a sectional view of a multichip semiconductor device according to a second embodiment of the present invention. In this figure, like reference numerals are used to denote corresponding parts to those in FIG. 4 and their detailed descriptions are omitted.

This embodiment is designed such that only the center chip 1b has connect plugs (metal plug 4 and insulating film 5).

Pads 6 formed in the multilevel interconnection layer 3 of the chip 1a are electrically connected through solder bumps 8 with pads 6 formed in the multilevel interconnection layer 3 of the chip 1b, allowing the chips 1a and 1b to be electrically connected with each other.

Metal plugs 4 of the chip 1b are electrically connected through solder bumps 8 with pads 6 formed in the multilevel interconnection layer 3 of the chip 1c. In this manner, the chips 1a, 1b and 1c are electrically connected with one another.

The second embodiment provides the same advantages as the first embodiment. However, the chips can be stacked in number up to three because only the center chip 1b is formed with the connect plugs. Nevertheless, this embodiment is advantageous in cost because only one chip is required to have the connect plugs.

Third Embodiment

Figure 6:
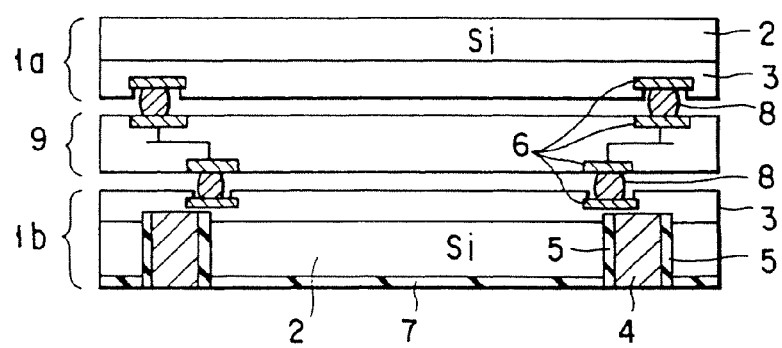
FIG. 6 is a sectional view of a multichip semiconductor device according to a third embodiment of the present invention.

FIG. 6 is a sectional view of a multichip semiconductor device according to a third embodiment of the present invention. In this figure, like reference numerals are used to denote corresponding parts to those in FIG. 4 and their detailed descriptions are omitted.

In this embodiment, two chips 1a and 1b are connected together with an interconnecting substrate 9 made of a ceramic interposed therebetween.

The pads 6 formed in the multilevel inter-connection layer 3 of the chip 1a are electrically connected through the solder bumps 8 with the pads 6 formed on the interconnecting substrate 9. The pads 6 formed on the rear side of the interconnecting substrate 9 each of which is electrically connected with a respective one of the pads on the top side of the substrate are electrically connected with the pads 6 formed in the multilevel interconnection layer 3 of the chip 1b. Thus, the chips 1a and 1b are electrically connected with each other.

The third embodiment also provides the same advantages as the first embodiment. The third embodiment permits the device to be tested by putting a probe to the pads 6 formed in the multilevel inter-connection layer 3 of the chip 1b.

In contrast, with such a structure as shown in FIG. 5 in which a chip formed with metal plugs is interposed between other chips, such testing cannot be made.

Fourth Embodiment

FIGS. 7A through 7I are sectional views in the order of steps of a method of forming a multichip semiconductor device according to a fourth embodiment of the present invention.

Figure 7A:
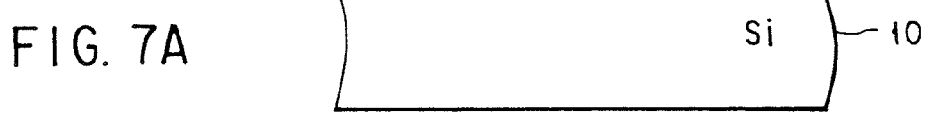
FIGS. 7A through 7I are sectional views illustrating a method of forming a chip for a multichip semiconductor device according to a fourth embodiment of the present invention.

First, as shown in FIG. 7A, a silicon substrate 10 is prepared. The silicon substrate has circuit components already formed therein and hence its major surface is covered with a first interlayer insulating film 11. The insulating film is made of a material which, like silicon nitride, has high etch selectivity to silicon dioxide ($SiO_2$).

Figure 7B:
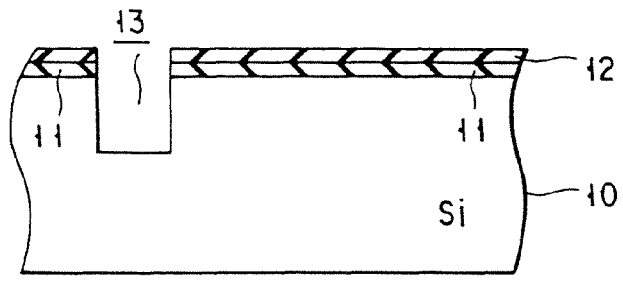

Next, as shown in FIG. 7B, a mask pattern 12 of silicon dioxide is formed over the first interlayer insulating film 11 to a thickness of 1 µm. By using the mask pattern 12 as a mask, the first interlayer insulating film 11 and the silicon substrate 10 are then etched by means of RIE using an etching gas containing a fluorine (F)-based gas, thereby forming a hole 13 that passes through the first interlayer insulating film 11 but not the silicon substrate 10.

After that, annealing is preferably performed so as to recover from defects in the silicon substrate 10 which have been produced in forming the hole 13.

The depth of the hole in the silicon substrate 10 is 100 µm. The overall depth of the hole is the sum of 100 µm and the thickness of the first interlayer insulating film 11. The hole 13 eventually becomes a through hole.

The hole 13 can be formed by first etching the silicon substrate 10 by means of RIE to form a hole, and then forming the first interlayer insulating film 11 and etching the first interlayer insulating film or the insulating film and the silicon substrate 10 by means of RIE.

In this case, as a mask pattern used in etching the silicon substrate for the first time, a material, such as $SiO_2$, Al, or $Al_2O_3$, may be used.

The processing technique of forming the hole 13 (through hole) is not limited to RIE. For example, photoetching, wet etching, ultrasonic machining or electric discharge machining can be used. In addition, these processing techniques may be suitably used in combination. A method in which wet etching is combined with RIE or photoetching will be described later.

Figure 7C:
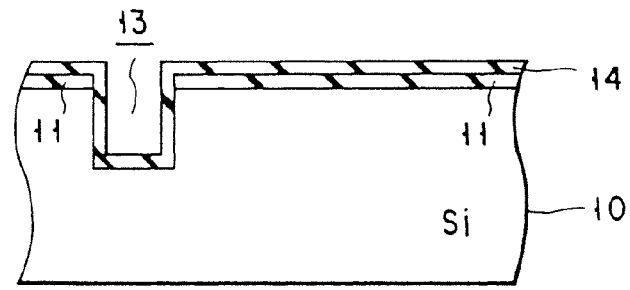

Next, as shown in FIG. 7C, an $SiO_2$ film of 100 nm in thickness and an $Si_3N_4$ film of 100 nm in thickness are sequentially deposited over the entire surface by means of LPCVD to form an insulating film (first insulating film) 14 of $SiO_2/Si_3N_4$. Instead of the multilayered insulating film 14, a single layer of insulating film may be used.

Figure 7D:
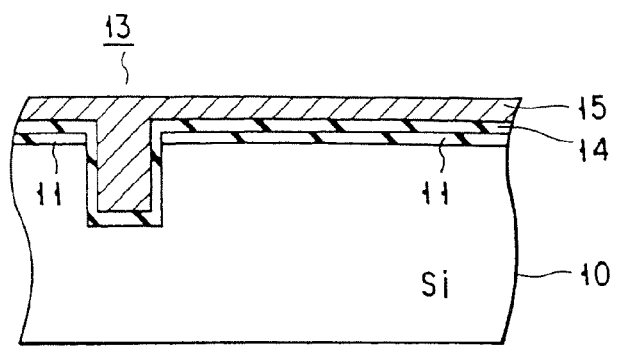

Next, as shown in FIG. 7D, a metal film 15 is formed over the entire surface to such a thickness that the hole 13 is filled with the metal film serving as a metal plug.

Examples of materials of the metal film 15 include tungsten (W), molybdenum (Mo), nickel (Ni), titanium (Ti), and their metal silicides. Examples of methods of forming the metal film include CVD, sputtering, and plating.

Figure 7E:
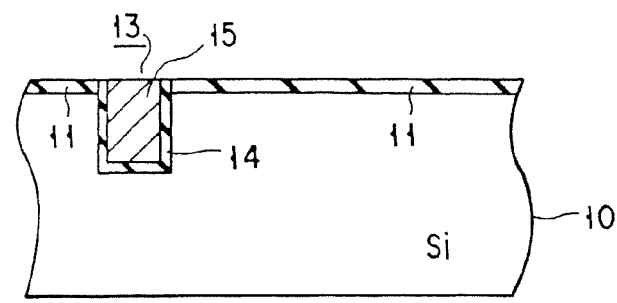

Next, as shown in FIG. 7E, the metal film 15 and the insulating film 14 are removed by means of CMP, etchback, or the like until the surface of the first interlayer insulating film 11 is exposed.

As a result, a structure is formed in which the metal film (metal plug) 15 has been buried in the hole 13. Such a structure can be formed by another method, which will be described later with reference to FIGS. 16A through 16F.

Figure 7F:
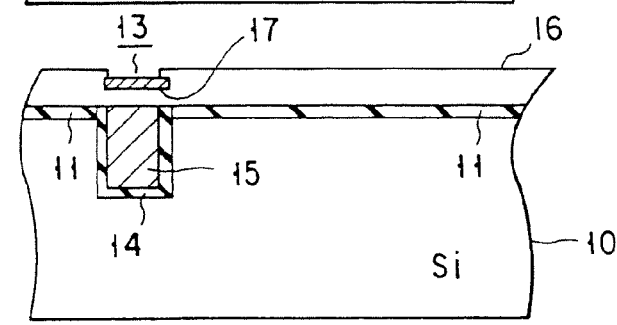

Next, as shown in FIG. 7F, a multilevel interconnection structure 16 is formed over the silicon substrate 10 which forms a multilevel interconnection layer with the first interlayer insulating film 11. The multilevel interconnection structure 16 is formed of a metal interconnect layer, an interlayer insulating film, a plug, etc. After that, a groove is formed in the surface of the multilevel interconnection layer 16 and a pad 17 is then formed in that groove.

Figure 8:
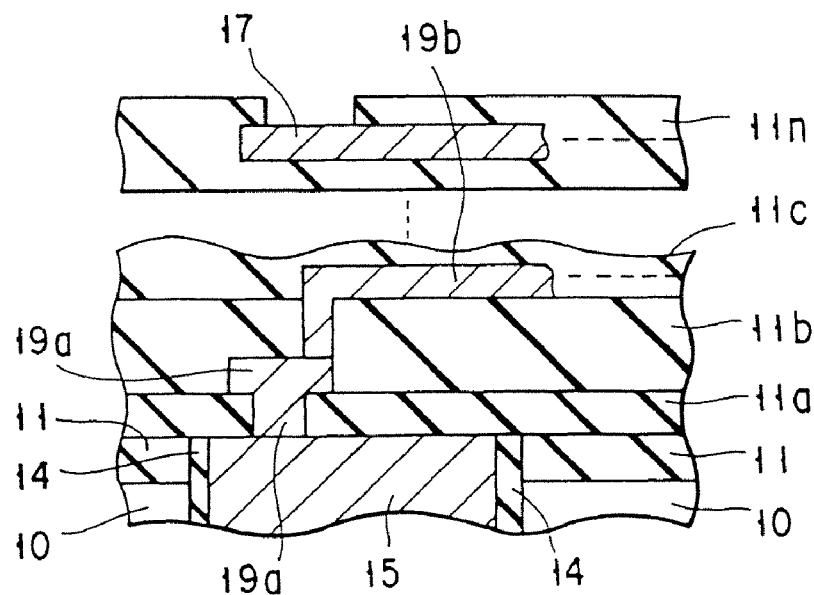
FIG. 8 is a sectional view of a multilayer interconnection in a region where a through hole is formed.
Figure 9:
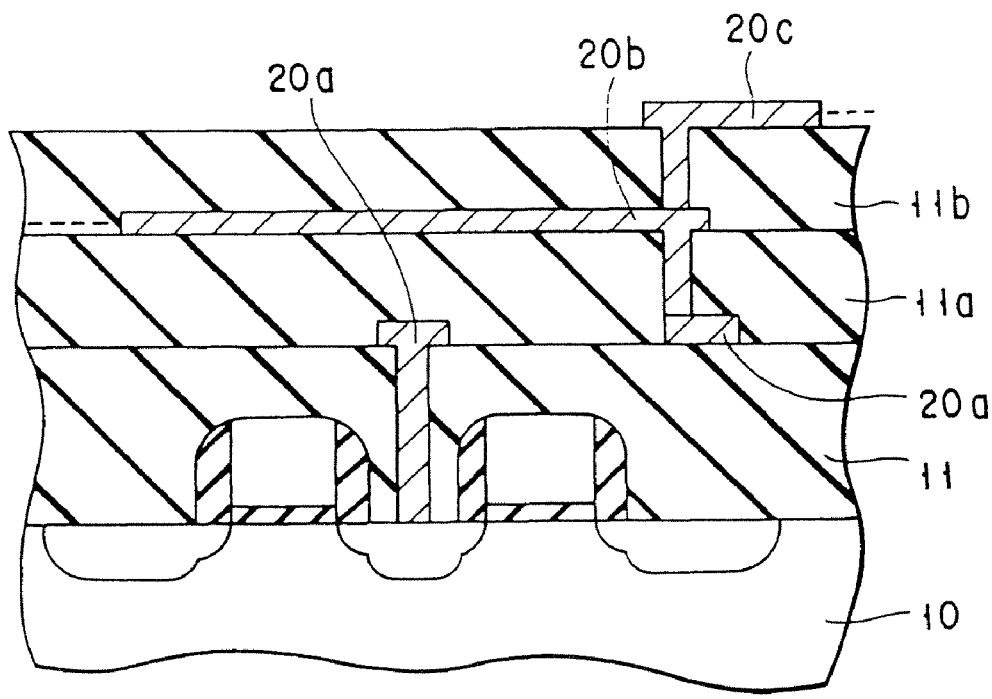
FIG. 9 is a sectional view of a multilayer interconnection in a device region.

FIG. 8 shows the structure of the multilevel interconnection layer in the vicinity of the hole 13, and FIG. 9 shows the structure of the multilevel interconnection layer in the device region.

Figure 11A:
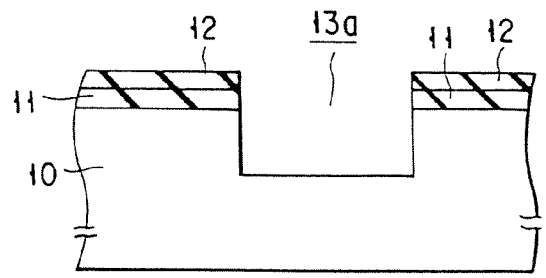
FIGS. 11A through 11D are sectional views illustrating another method of forming a through hole.

As shown in FIG. 9, MOS transistors are formed in the device region. In FIGS. 8 and 9, 11a denotes a second interlayer insulating film, 11b a third interlayer insulating film, 11c a fourth interlayer insulating film, 11n an nth interlayer insulating film, 19a and 20a a first metal interconnection, 19b and 20b a second metal interconnection, and 20c a third metal interconnection.

Figure 7G:
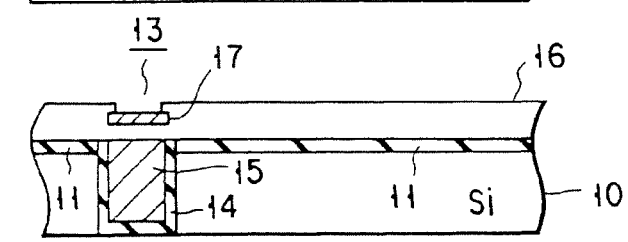

Next, as shown in FIG. 7G, a portion of the silicon substrate 10 is stripped off (removed) from its rear side opposite to the surface in which the hole 13 is formed until the insulating film at the bottom of the hole 13 is exposed.

Making the silicon substrate 10 thinner can be accomplished by the use of CMP, chemical polishing, mechanical polishing, wet etching, plasma etching, gas etching, or a combination thereof. Among these techniques, CMP is the most typical and preferably used.

The step in FIG. 7G is preferably performed under the conditions that high selectivity is attained between the silicon substrate 10 and the insulating film 14. Under such conditions, the processing will be terminated automatically at the insulating film 14.

Figure 7H:
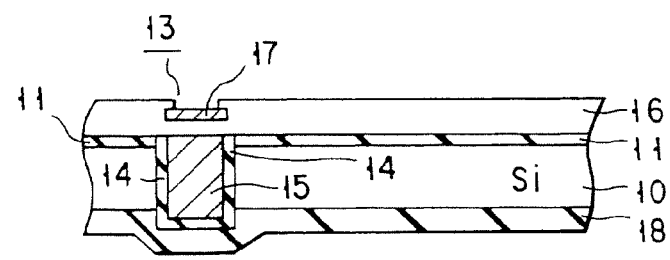

Next, as shown in FIG. 7H, the rear side of the silicon substrate 10 is selectively etched until a portion of the insulating film 14 which is formed on the sidewall of the hole 13 and located above the insulating film at the bottom of the hole is exposed.

This process is performed by means of either wet etching or dry etching such CDE or RIE. Instead of etching, CMP may be used.

After that, the damaged layer produced by the etching or CMP is removed by wet etching by way of example. This removing process is not required when no damage occurs. The reason it is removed is that the damaged layer adversely affects the formation of an $SiO_2$ film 18 in the subsequent step.

Next, the $SiO_2$ film 18 (second insulating film) is formed over the entire surface of the rear side of the silicon substrate 10 by means of plasma CVD.

Where a low-temperature process is required, a coating of SOG or the like is preferably used instead of the $SiO_2$ film 18. In order to reduce the stress to which the silicon substrate is subject, an organic film, such as a polyimide film, is preferably used instead of the $SiO_2$ film 18.

Figure 7I:
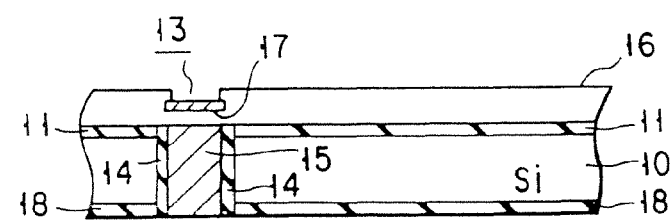

Next, as shown in FIG. 7I, the $SiO_2$ film 18 and the interlayer insulating film 14 are polished by means of CMP until the metal plug 15 is exposed.

As a result, a structure is completed in which a connect plug consisting of the insulating film 14 and the metal plug 15 is buried in the through hole (the hole 13) and the rear side of the silicon substrate 10 is covered with the $SiO_2$ film 18.

As described above, according to the first embodiment of the present invention, by forming a hole 13 in the silicon substrate 10 and then polishing the rear side of the silicon substrate so as to allow the hole to pass through the substrate, a structure is formed in which a connect plug (insulating film 14 and metal plug 15) is buried in the through hole (hole 13).

Accordingly, such a structure can be formed readily because there is no need of forming a through hole even if the original silicon substrate is thick (normally it is thick).

Unlike a method which forms a through hole by etching a thick silicon substrate from its rear side as well, the method of this embodiment has no requirement of photolithography that needs accurate registration of front and rear patterns with each other. Thus, the connect plug forming process becomes simpler and requires less steps.

Where there is no need of covering the rear side of the silicon substrate with the $SiO_2$ film 18, the step of FIG. 7G to polish the silicon substrate 10 and the interlayer insulating film 14 is continued until the metal plug 15 is exposed. This also results in the structure in which the connect plug is buried in the through hole.

The polishing of the silicon substrate 10 is preferably performed after it has been cut out from a wafer. This is because it is difficult to polish uniformly the wafer, which is generally large and exhibits low mechanical strength.

The hole 13 and the metal plug 15 are formed prior to the formation of metal interconnections. Thus, the metal interconnections are not affected by heat treatment for forming the metal plug. Further, the metal interconnections are not affected by annealing for recovery from defects which is performed after the formation of the hole 13.

This allows the metal plug 15 to be formed of conductive paste of low resistance such as gold (its sintering temperature is about 600°) when aluminum (its melting point is 660° C.) is used for the metal inter-connections.

The metal plug is formed after the formation of circuit devices. Thus, degradation of device characteristics due to diffusion of the metal forming the metal plug can be prevented.

That is, when the circuit devices are formed after the metal plug has been formed, the heat treatment necessary to form the circuit devices causes the metal to diffuse into the device regions, thereby degrading the device characteristics.

FIGS. 10A through 10D are sectional views of variously structured connect plugs. These sectional views correspond to the step of FIG. 7F. In these figures, 19 denotes a metal interconnection.

Figure 10A:
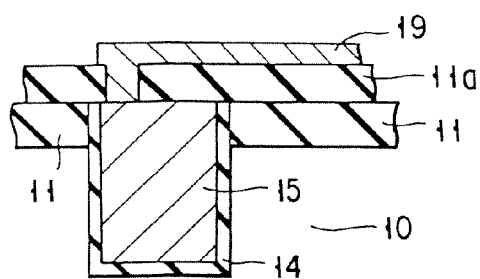
FIGS. 10A through 10D are sectional views of metal plugs.

FIG. 10A shows a connect plug according to the present embodiment.

Figure 10B:
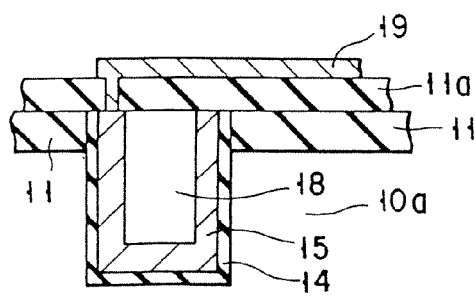

FIG. 10B shows a connect plug which has a low stress film 18 formed therein.

That is, with this connect plug, the metal plug 15 is formed so that an unfilled region is formed in the through hole. In the unfilled region is formed the low stress film 18 which is smaller than the metal plug 15 in the difference in thermal expansion coefficient from the semiconductor substrate 10a, thereby filling up the through hole.

The low stress film 18 may be either an insulating film, a semiconductor film, or a metal film. To be specific, the film 18 may be a conductive paste film, a FOX film, an SOG film, or an $SiO_2$ film formed by HDP (High Density Plasma)-CVD.

The use of such a connect plug can prevent degradation of device characteristics due to defects in the silicon substrate 10 caused by a large stress imposed on the connect plug formed region.

Figure 10C:
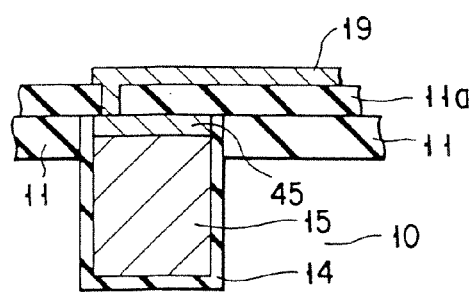

FIG. 10C shows a connect plug having a cap metal film 45.

That is, the metal plug 15 is not formed so as to fill up the through hole. The metal film 15 is formed on the top surface of the metal plug 15, thereby filling up the through hole.

Figure 10D:
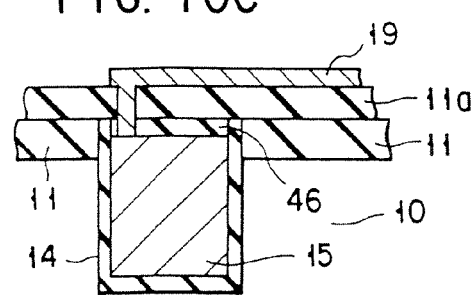

FIG. 10D shows a connect plug which uses a cap insulating film 46 instead of the cap metal film 45 of FIG. 10C.

By forming such a cap metal film 45 or a cap insulating film 46, the surface of the metal plug 15 is made flat, allowing the fine metal interconnect line 19 to be formed readily above the metal plug 15.

The use of the cap insulating film 46 that can be formed at low temperature can avoid such a disadvantage as the surface of the metal plug 15 is oxidized in post steps.

FIGS. 11A through 11D are sectional views in the order of steps of forming the hole 13 in accordance with another method. This method combines RIE or photoetching with wet etching.

First, as shown in FIG. 11A, a first interlayer insulating film 11 is formed over the major surface {100} of a silicon substrate 10. A mask pattern 12 is then formed on the first interlayer insulating film 11. By using the mask pattern 12 as a mask, the first interlayer insulating film 11 and the silicon substrate 10 are selectively etched to form a hole 13a rectangular in section.

As the etching technique, use is made of RIE or photoetching such as photochemical etching or photoabrasion etching. In particular, photoetching is suitable for forming the deep hole 13a because it has advantages of high speed and low damage. For photoetching, a $Cl_2$ gas is used as an etching gas and ultraviolet rays are used as excitation light.

Figure 11B:
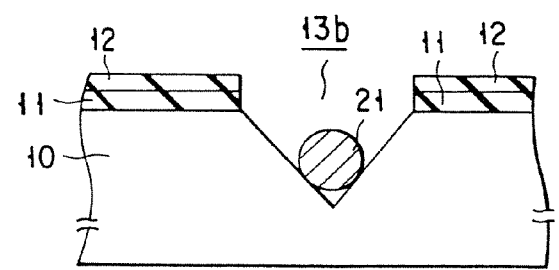

Next, as shown in FIG. 11B, the silicon substrate 10 is subjected to wet etching using the mask pattern 12 as a mask, thereby exposing the {111} plane. As a result, a hole 13b triangular in section is formed. As an etchant, use is made of a KOH solution maintained at temperatures from 60 to 90° C.

Next, as shown in FIG. 11B, a metal 21, such as nickel (Ni), titanium (Ti), zirconium (Zr), hafnium (Hf), or vanadium (V), is placed inside the hole 13b. To be specific, the metal 21 is placed at the bottom of the hole 13b.

Figure 11C:
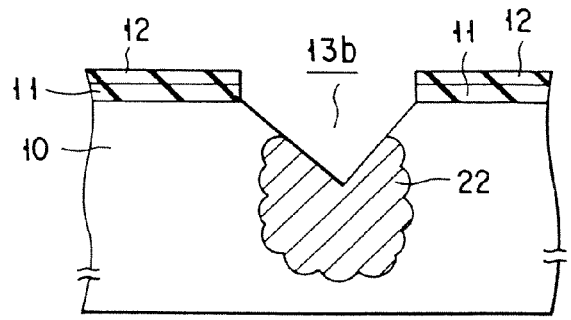

Next, as shown in FIG. 11C, heat treatment is carried out to cause the metal 21 to react with the silicon substrate 10. As a result, a layer 22 of metal silicide is formed in that portion of the silicon substrate 10 which is located below the bottom of the hole 13b.

Figure 11D:
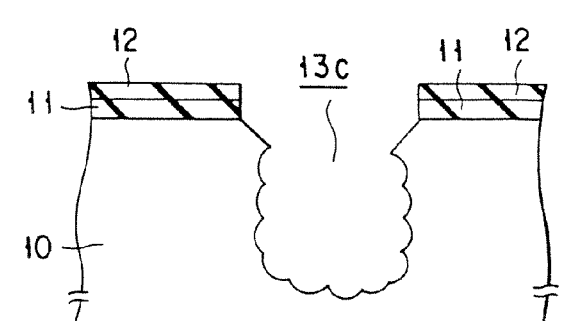

Next, as shown in FIG. 11D, the metal silicide layer 22 is selectively etched away to form a hole 13c deeper than the hole 13b. Finally, an insulating film is formed, a metal is buried in the hole 13c, and then the rear side of the substrate is polished, whereby a deep through hole is formed.

By making a hole deeper in steps in this manner, a deep hole and a through hole can be formed readily.

FIGS. 12A, 12B and 12C show other methods of forming a metal plug.

FIG. 12A shows a method of forming a metal plug by first coating the entire surface with a conductive paste 23 and then fluidizing the conductive paste by means of heat treatment to thereby bury the paste in the hole. The excessive conductive paste outside the hole can be removed by means of CMP by way of example.

FIG. 12B shows a method by which metal grains 24 are deposited onto the entire surface to fill the hole and then excessive grains outside the hole are removed by means of CMP.

In this method, a solvent (suspension) in which metal grains are dispersed may be used instead of the metal grains.

FIG. 12C shows a method of forming a metal silicide layer 26 by first depositing a silicon film 25 over the entire surface, next depositing a layer of refractory metal (not shown), such as titanium, on the silicon layer 25, and then causing the refractory metal layer to react with the silicon layer 25 by heat treatment. The excessive metal silicide layer 26 outside the hole is etched away by means of CMP by way of example.

The silicon layer is deposited on the insulating film with conformality. The silicon layer and the metal film exhibit high adhesion. With the method of FIG. 12C, therefore, since the entire surface of the interlayer insulating film 14 inside the hole is covered with the silicon layer 25 even if the hole is deep, the metal silicide layer 31 is formed over the entire surface of the insulating film 14 inside the hole. If a cavity is left inside the hole, it is preferably filled with a low stress film.

FIGS. 13A, 13B and 13C show still another method of forming a metal plug.

First, as shown in FIG. 13A, a silicon film 27 is formed so as to cover the sidewalls and bottom of the hole 13. After that, as shown in FIG. 13A, Ni grains (metal balls) 28 of the order of 10μ in diameter are placed in the hole.

Next, as shown in FIG. 13B, heat treatment is carried out to cause the Ni grains to react with the silicon film 27, thereby forming a nickel silicide layer 29 in the hole. Since the silicon film 27 and the Ni grains 28 in the hole are not sufficient in amount, a cavity is left above the nickel silicide layer 29.

Finally, as shown in FIG. 13C, an insulating layer or metal layer, serving as a cap layer 30, is formed over the entire surface and then the insulating layer or metal layer is polished to thereby fill the cavity with the cap layer 30.

The method of forming a metal plug is not limited to the methods described so far (the CVD method, the sputtering method, the plating method, the conductive paste-based method, the metal grain-based method, the metal ball-based method, and the suspension-based method). For example, these methods may be combined suitably.

FIGS. 14A to 14D show another method of forming a metal plug. This method differs from the methods so far in that a metal plug 15 is formed after a through hole has been formed by polishing the rear side of a silicon substrate 11.

Figure 14A:
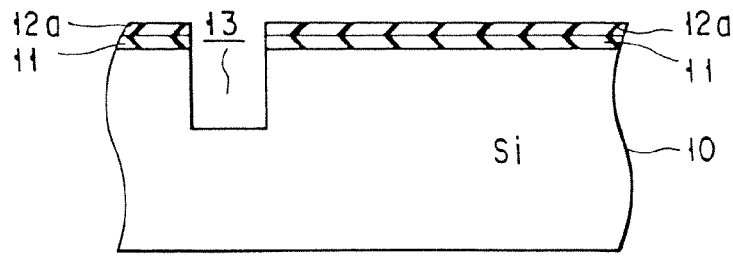
FIGS. 14A, 14B, 14C and 14D are sectional views illustrating another method of forming a connect plug.

First, as shown in FIG. 14A, a mask pattern 12a of aluminum is formed over the surface of the silicon substrate 10 into which circuit devices have been manufactured and the first interlayer insulating film 11 and the silicon substrate 10 are etched using the mask pattern 12a as a mask to thereby form a hole 13.

Figure 14B:
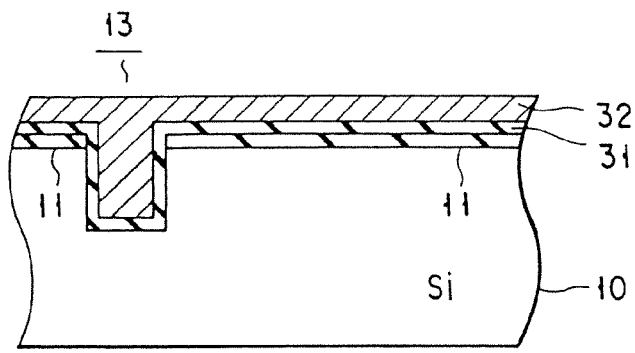

Next, as shown in FIG. 14B, an SOG film 31 is formed over the entire surface and then a FOX film 32 is formed over the entire surface so as to fill up the hole 13.

Figure 14C:
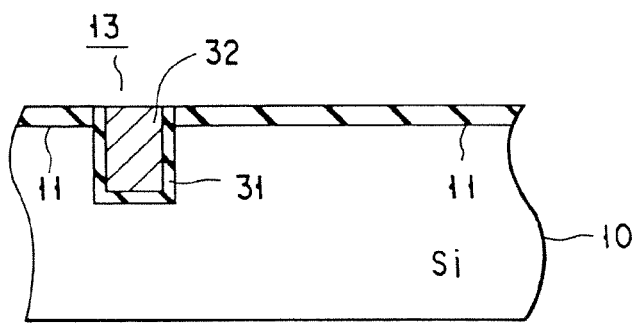

Next, as shown in FIG. 14C, the SOG film 31 and the FOX film 32 outside the hole 13 are removed by means of CMP or etchback by way of example.

After that, the steps shown in FIGS. 7E through 7I are performed.

Figure 14D:
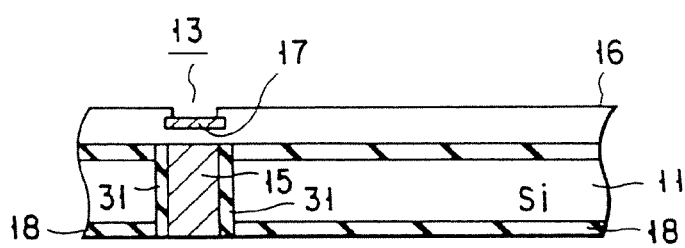
Figure 15:
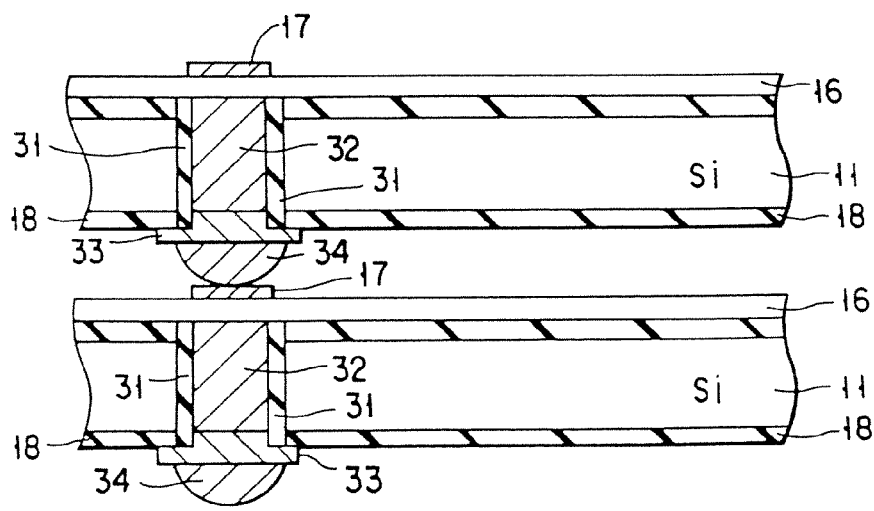
FIG. 15 is a sectional view illustrating another structure for connecting chips.

Next, as shown in FIG. 14D, the FOX film 32 inside the hole 13 is removed using CDE by way of example, and the metal plug 15 is buried in the hole in the same manner as the steps of FIGS. 7D and 7E.

Where chips are connected together as shown in FIG. 15, a pad 33 and a metal ball 34 made of gold are formed after the metal plug 15 has been formed.

FIGS. 16A through 16F show another method of forming a connect plug. This method differs from the methods described so far in that a metal plug 15 which has been formed in advance independently of a silicon substrate 10 is buried in a hole 13 formed in the silicon substrate.

In the first place, a method of forming the metal plug 15 will be described.

Figure 16A:
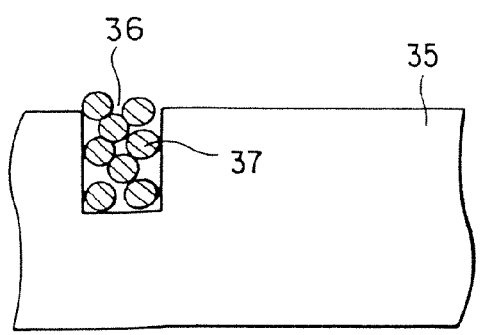
FIGS. 16A through 16F are sectional views illustrating still another method of forming a connect plug.

First, as shown in FIG. 16A, a groove 36 is formed in a substrate of silicon dioxide ($SiO_2$).

Next, as shown in FIG. 16A, metal balls 37 are buried in the groove 36.

Figure 16B:
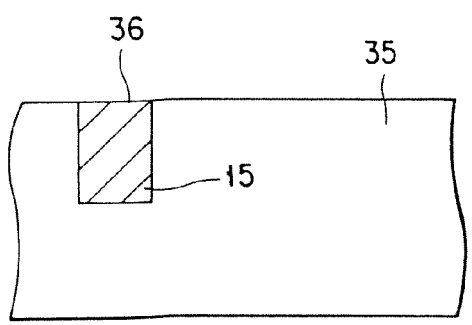

Finally, as shown in FIG. 16B, the metal balls 37 are fused by heat treatment, thereby forming the metal plug 15 in the groove 36.

A method of forming a connect plug using the metal plug 15 thus formed in advance will be described next.

Figure 16C:
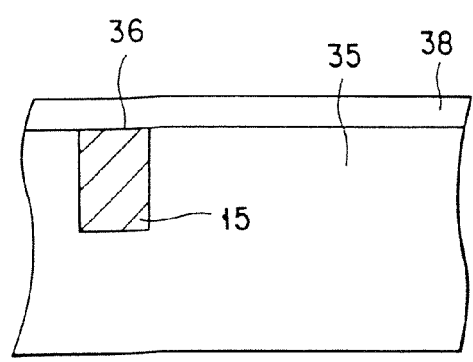

First, as shown in FIG. 16C, the metal plug 15 is glued to an adhesive film 38.

Figure 16D:
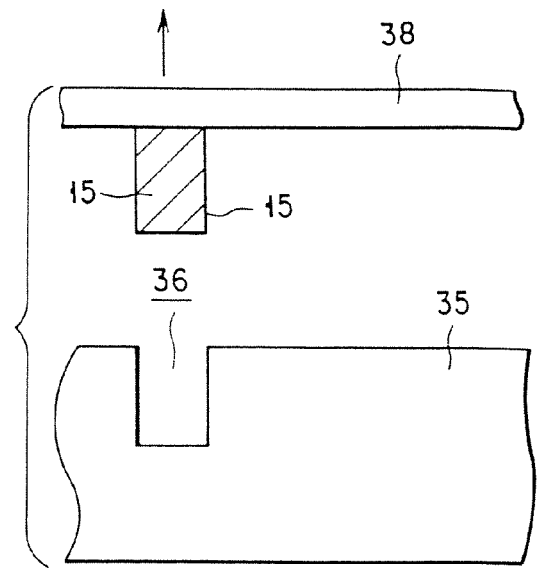

Next, as shown in FIG. 16D, the metal plug 15 glued to the adhesive film 38 is taken out of the groove 36.

Figure 16E:
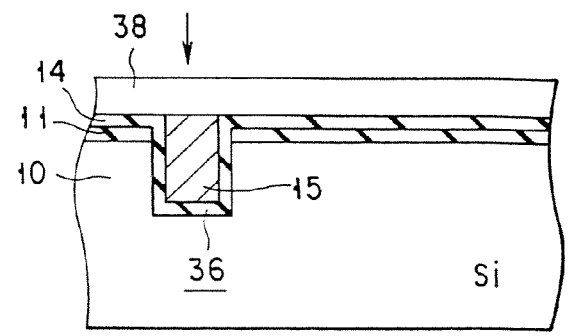

Next, as shown in FIG. 16E, the metal plug 15 glued to the adhesive film is inserted into the hole 13 of the silicon substrate 10 in the step of FIG. 7C. The adhesive film is then stripped off the metal plug.

Figure 16F:
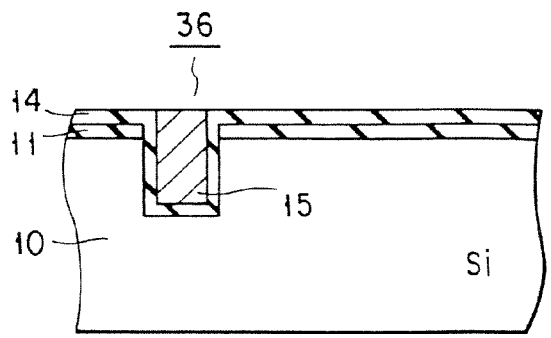

Next, as shown in FIG. 16F, the metal plug 15 is fused, so that it is fixed in the hole 13.

The method which employs the metal plug 15 formed in advance provides high throughput and allows the process temperature to be low as compared with a method by which a metal film, serving as the metal plug 4, is formed on the silicon substrate 10 using a film forming method such as sputtering, CVD, or the like.

Although, in this example, silicon dioxide is chosen as the material of the substrate 35, any other material may be used provided that it does not react with the metal balls 37.

Instead of the metal balls 37, a low-resistivity conductive paste made of gold, palladium, or the like may be used. In this case, the groove 36 is first filled with the conductive paste using screen printing and then the conductive paste is sintered, thereby forming the metal plug 15.

Although the conductive paste made of gold or palladium has a high sintering temperature, it does not matter because the paste is sintered on the substrate 35 that is different from the silicon substrate 10. Unlike ordinary one, the conductive paste need not contain resin or glass.

Instead of using the adhesive film 38 to take the metal plug 15 out of the groove 36, another means, such as tweezers, may be used.

By forming an adhesive layer in the hole 13 in advance, the metal plug 15 may be fixed in the hole 13. To be specific, after the hole 13 is coated with SOG or FOX to form an adhesive layer therein, the metal plug 15 is buried in the hole 13. After that, the adhesive layer is solidified.

Fifth Embodiment

Figure 17A:
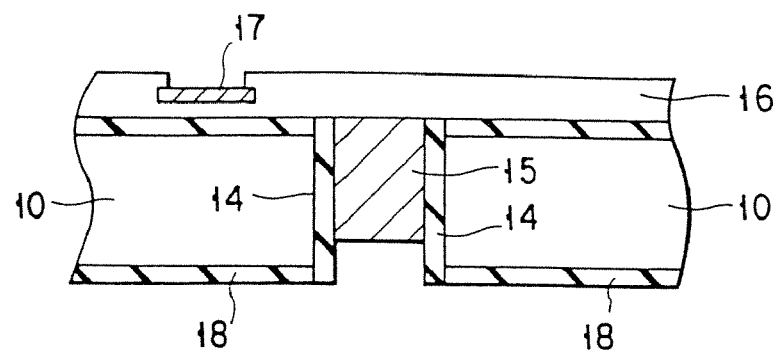
FIGS. 17A and 17B are sectional views illustrating a method of forming a chip for a multichip semiconductor device according to a fifth embodiment of the present invention.
Figure 17B:
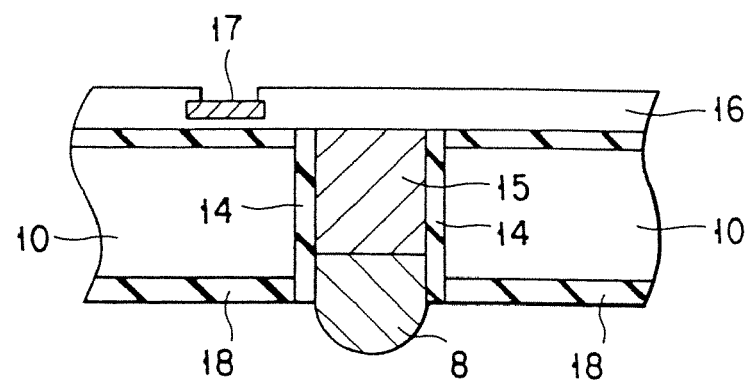

FIGS. 17A and 17B are sectional views illustrating a method of forming chips for a multichip semiconductor device according to a fifth embodiment of the present invention. In these figures, like reference numerals are used to denote corresponding parts to those in FIGS. 7A through 7I and their detailed descriptions are omitted.

In this embodiment, following the step of FIG. 7I in the fourth embodiment, the metal plug 15 is etched from the rear side of the silicon substrate 10 as shown in FIG. 17A, thereby forming an unfilled region in the through hole.

Next, as shown in FIG. 17B, the metal plug 15 (the recess forming the unfilled region of the through hole) and a solder bump 8 are registered with each other, then connected together.

In this case, it is preferable that the registration of the metal plug 15 and the solder bump 8 with each other be performed through image processing. This is because the recess corresponding to the unfilled region of the through hole and other portions appear on an image with a great difference in light and shade and hence an accurate registration can be performed easily.

The recess allows the sidewall of the bump 8 and the sidewall of the through hole to be brought into contact with each other. Thus, the bump can be fixed more firmly than without the recess.

Conversely, the metal plug 15 may be formed to protrude from the through hole. In such a case, the bump 8 will not be brought into contact with the silicon substrate 10, preventing the silicon substrate from being contaminated by the solder bump.

Sixth Embodiment

Figure 18:
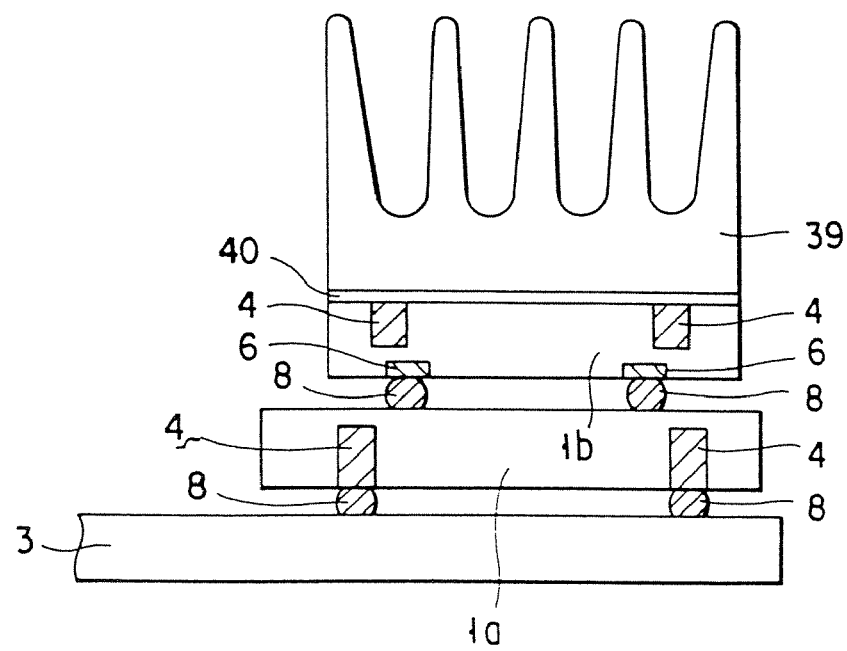
FIG. 18 is a sectional view of a multichip semiconductor device according to a sixth embodiment of the present invention.

FIG. 18 is a sectional view of a multichip semiconductor device according to a sixth embodiment of the present invention. In this figure, like reference numerals are used to denote corresponding parts to those in FIG. 4 and their detailed descriptions are omitted. In chips 1a and 1b, the multilevel inter-connection layer 3, the insulating films 5 and 7 and the pads 6 are omitted.

The feature of this embodiment is that a radiation fin 39 is placed on the chip 1a. The radiation fin is fixed to the chip 1a by adhesive 40. Alternatively, the fin may be fixed to an insulating film by metallization.

According to the sixth embodiment, the metal plug 4 and the radiation fin 39 can enhance the heat radiation capability of the device.

Seventh Embodiment

Figure 19A:
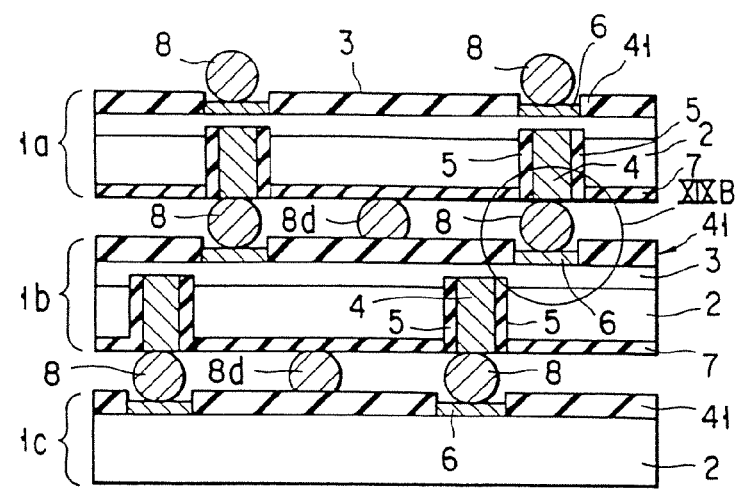
FIG. 19A is a sectional view of a multichip semiconductor device according to a seventh embodiment of the present invention.
Figure 19B:
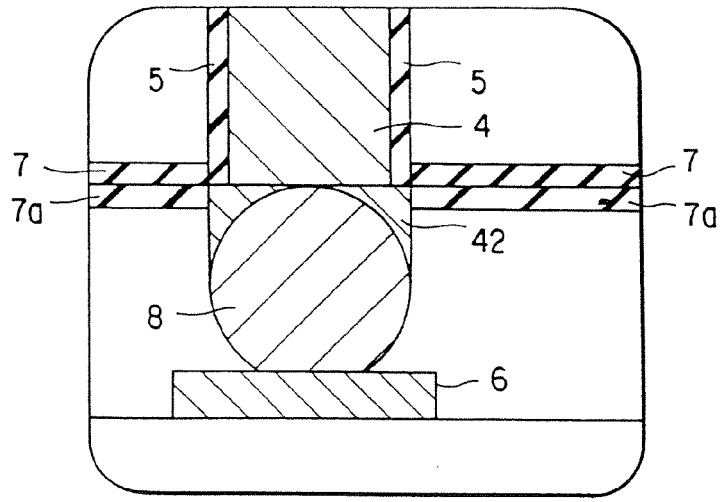
FIG. 19B is an enlarged view of a portion of the semiconductor device of FIG. 19A.

FIG. 19A is a sectional view of a multichip semiconductor device according to a seventh embodiment of the present invention, and FIG. 19B is an enlarged view of a bump 8 in FIG. 19A. In these figures, like reference numerals are used to denote corresponding parts to those in FIG. 4. Reference numeral 7a denotes an insulating film, and 42 a solder.

This embodiment features the provision of a heat radiation dummy bump 8d between chips 1a and 1b.

By the dummy bump 8d, the chips 1a and 1b are mechanically connected with each other but not electrically connected together. The dummy bump connects the chips 1a and 1b with each other through a metal film not shown.

The dummy bump may be formed of a metal such as gold. Alternatively, a semiconductor or insulating material may be used provided that it is good in heat conduction. Further, a filler can be used for the dummy bump. If the dummy bump 8d and the interconnect bump 8 are made of the same material, they can be formed simultaneously, checking an increase in the number of manufacturing steps.

The dummy bump 8d alone can improve the heat radiation capability. In order to further enhance the heat radiation capability, it is preferable to couple the dummy bump 8d to a radiation fin.

Eighth Embodiment

Figure 20:
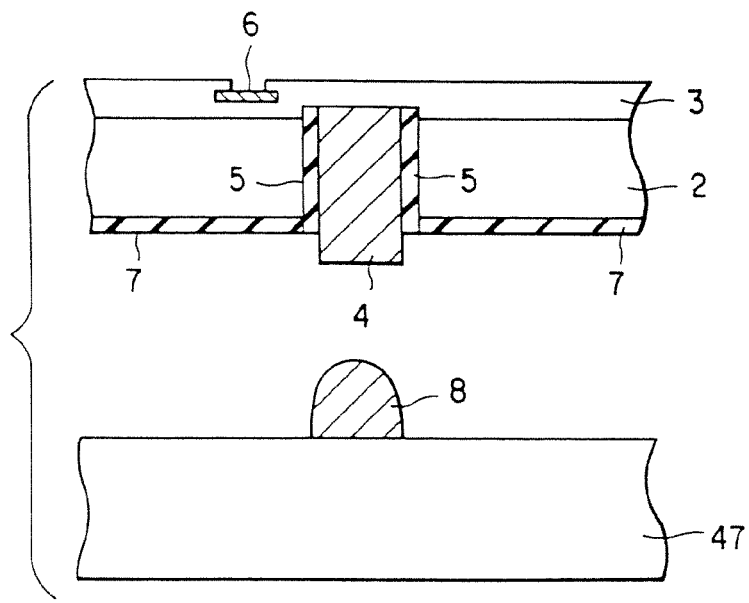
FIG. 20 is a sectional view of a multichip semiconductor device according to an eighth embodiment of the present invention.

FIG. 20 is a diagram for use in explanation of a method of manufacturing a multichip semiconductor device according to an eighth embodiment of the present invention.

Although, in the seventh embodiment described in connection with FIGS. 17A and 17B, the solder bump 8 is formed on the metal plug 15, in the present embodiment a solder bump 8 is formed on a member 47 (for example, a chip with metal plugs, a chip with no metal plug, or an interconnection substrate) to which a connection is made. A metal plug 4 formed to protrude from the rear side of a silicon substrate 2 is brought into contact with the solder bump 8.

In this embodiment as well, the bump 8 is kept away from the silicon substrate 10, preventing the silicon substrate from being contaminated by the bump.

Ninth Embodiment

Figure 21:
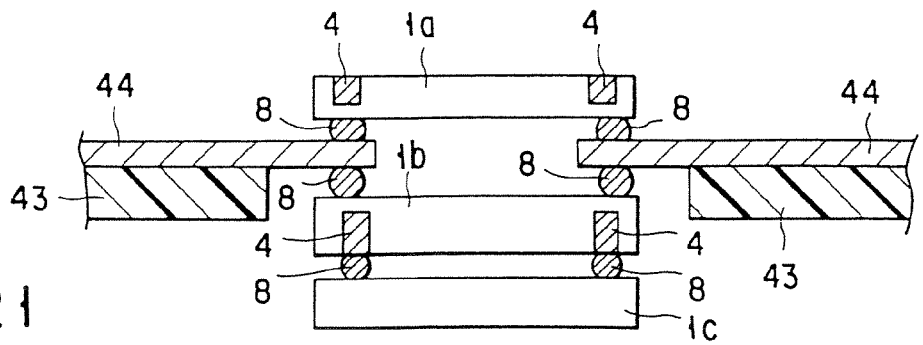
FIG. 21 is a sectional view of a multichip semiconductor device according to a ninth embodiment of the present invention.

FIG. 21 is a sectional view of a multichip semiconductor device according to a ninth embodiment of the present invention. In this figure, like reference numerals are used to denote corresponding parts to those in FIG. 4. In chips 1a, 1b, and 1c, the multilevel interconnection layer 3, the insulating films 5 and 7 and the pads 6 are omitted. The chip 1c need not necessarily be provided with metal plugs.

Figure 22:
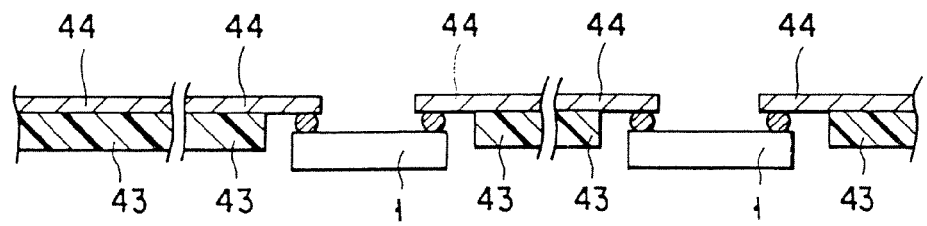
FIG. 22 is a diagram for use in explanation of a conventional multichip semiconductor device using a TAB tape.

The present embodiment uses a TAB tape as a packing member. In FIG. 21, 43 denotes a plastic tape, and 44 a lead terminal. In FIG. 22 there is illustrated a conventional multichip semiconductor device using TAB tape. As can be seen from comparison between FIGS. 21 and 22, the semiconductor device of the present embodiment is smaller in plane area than the conventional semiconductor device.

According to the present embodiment, chips can be stacked, which, in addition to the advantage of small plane area, allows all the chips, some chips, or each chip to be tested through the use of metal plugs 4.

For testing of the entire semiconductor device, a probe is put to a pad (not shown) on the multilevel interconnection layer of the chip 1a. For testing of the chips 1a and 1b, the probe is put to a pad on the multilevel interconnection layer of the chip 1b after the chips 1a and 1b have been connected together.

Tenth Embodiment

FIGS. 23A through 23F are sectional views in the order of steps of a method of forming a multichip semiconductor device according to a tenth embodiment of the present invention.

Figure 23A:
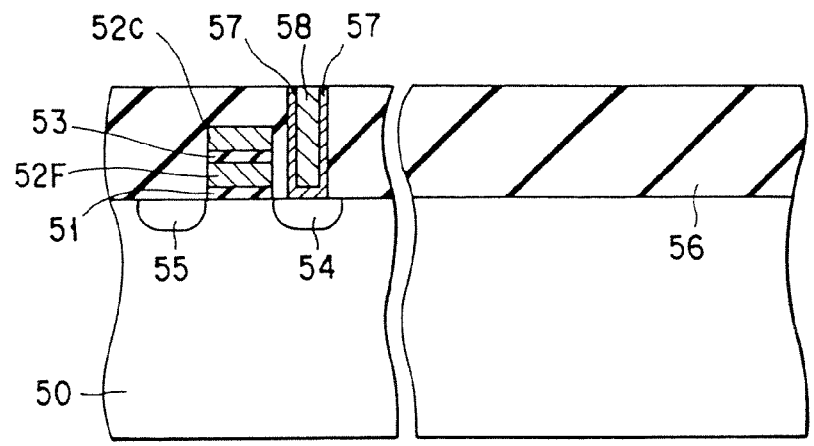
FIGS. 23A through 23F are sectional views illustrating a method of manufacturing a multichip semiconductor device according to a tenth embodiment of the present invention.

After NAND type EEPROM memory cells and peripheral devices (not shown) have been manufactured into a silicon substrate 50 using well known techniques as shown in FIG. 23A, a first interlayer insulating film 56 is formed.

In FIGS. 23A through 23F, 51 denotes a tunnel oxide layer, 52F a floating gate electrode, 53 an intergate insulating film, 52C a control gate electrode, 54 a source diffused region, and 55 a drain diffused region. Although, in practice, a large number of memory cells are formed, only one memory cell is illustrated for the purpose of simplifying illustration.

Next, as shown in FIG. 23A, a contact hole is formed in the first interlayer insulating film 56 and then a Ti/TiN layer 57 and a W bit line plug 58 are sequentially formed in the contact hole.

More specifically, the contact hole is formed first, and a Ti film, a TiN film and a W film are then formed in sequence over the entire surface. Note that the W film is formed by blanket CVD. Finally, the W film, the Ti film and the TiN film outside the contact hole are removed by means of CMP.

Figure 23B:
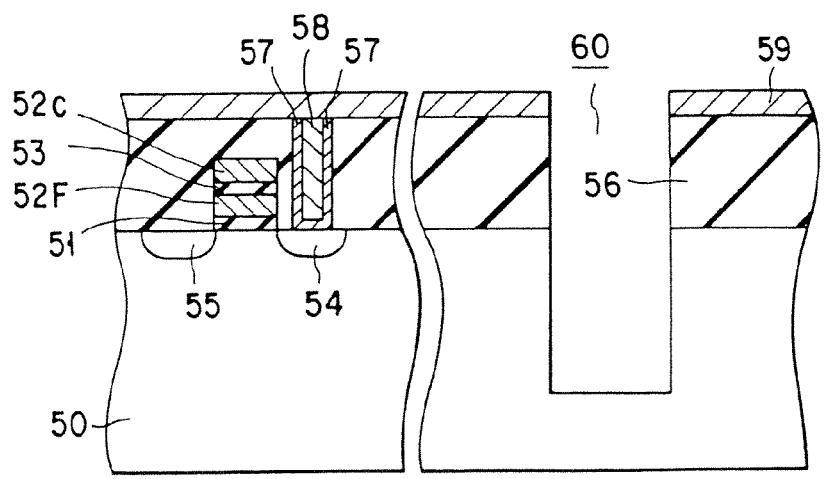

Next, as shown in FIG. 23B, a mask pattern 59 of, for example, aluminum is formed on the first interlayer insulating film 56, and then the regions of the first insulating film 56 and the silicon substrate 50 where connect plugs are to be formed are etched using the mask pattern as a mask. Thus, a square hole 56 is formed which is 100 μm on a side and has a depth of 150 to 200 μm. After this process, the mask pattern 59 is removed.

Figure 23C:
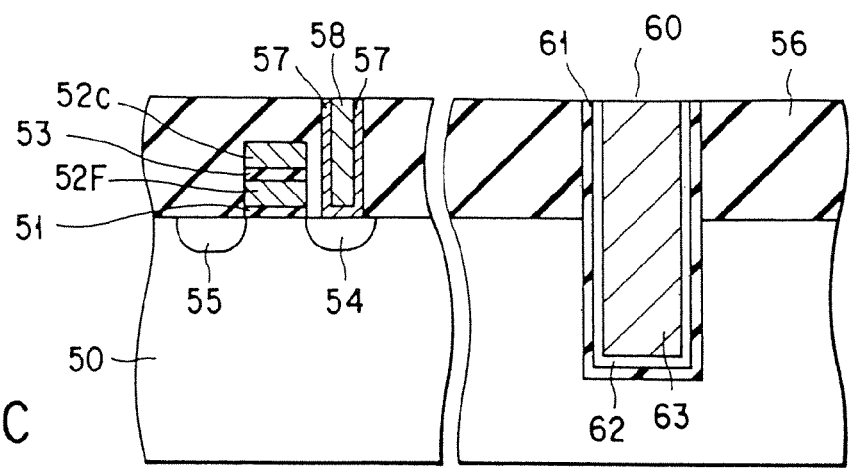

Next, as shown in FIG. 23C, an $SiO_2$ film 61 is formed on the sidewall of the hole 60 and a polycrystalline silicon film 62 of 500 nm in thickness is formed on the $SiO_2$ film. After that, a nickel film 63 as a metal plug is formed to fill up the hole 60.

More specifically, the $SiO_2$ film 61 of 500 nm in thickness, the polycrystalline silicon film 62 of 500 nm in thickness and the nickel film 63 are formed in sequence over the entire surface and then surpluses of the $SiO_2$ film, the silicon film 62 and the nickel film outside the hole are removed.

The nickel film 63 is formed by first burying nickel paste in the hole 60 using screen printing by way of example and then sintering that paste at a temperature of 600°.

Figure 23D:
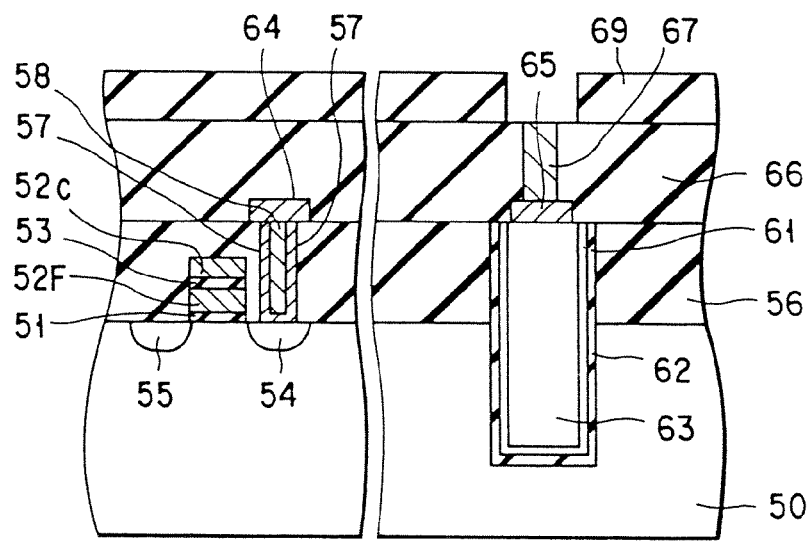

Next, as shown in FIG. 23D, a bit line 64 and a first interconnection layer 65 are formed by means of conventional techniques.

To be specific, a Ti film of 10 nm in thickness, a TiN film of 10 nm in thickness, an AlCu film of 400 nm in thickness and a TiN film of 40 nm in thickness are sequentially formed and then the resulting multilevel films are selectively etched by means of photo-lithographic and etching techniques, thereby forming the bit line 64 and the first interconnection line 65.

Next, as shown in FIG. 23D, a second interlayer insulating film 66 is formed and then a via hole is formed in the second insulating film. After that, a second interconnection film 68 is formed which connects with the first interconnection layer 65 through a plug 67.

The second interconnection layer 68 can be formed in the same way as the first interconnection layer 65. The plug 67 is formed of a film of, for example, tungsten. The second interconnection layer on the memory cell area is omitted.

Next, as shown in FIG. 23D, as a passivation film that covers the second interconnection layer 58, a photosensitive polyimide film 69 of 450 nm in thickness is formed by means of plasma CVD and an opening (pad opening) is then formed in that portion of the polyimide film which is located above the second interconnection layer 68. After that, it is preferable that each of chips formed on a wafer be electrically tested by putting a probe to the pad (not shown).

Figure 23E:
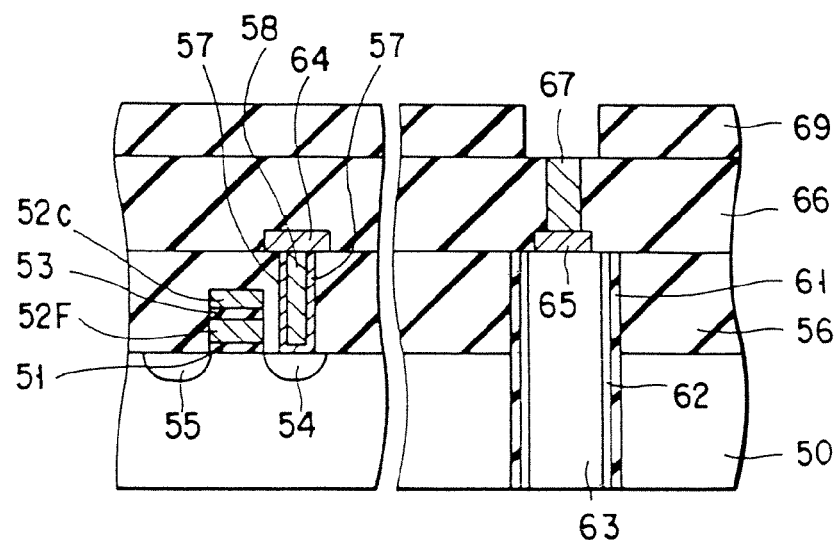

Next, as shown in FIG. 23E, the rear side of the silicon substrate 50 is mechanically polished to expose the nickel film 63.

This polishing process is preferably performed after the silicon substrate 50 has been cut out from the wafer. The reason is that the wafer is difficult to polish uniformly as described previously. Following the polishing process, damage resulting from polishing is removed by wet etching.

In order to allow individual chips to be automatically separated when the wafer thickness is reduced by polishing, it is preferable to score the wafer in advance.

Figure 23F:
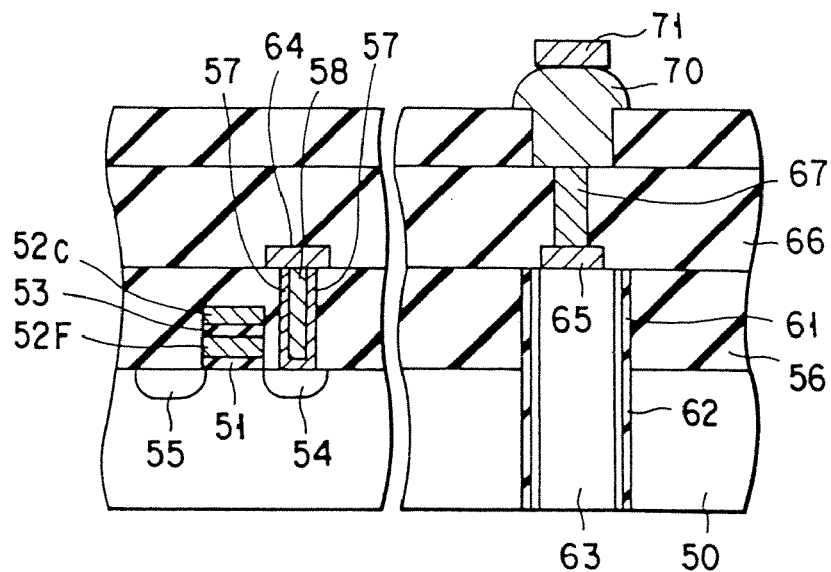

Next, as shown in FIG. 23F, an Au ball bump 70 is formed on the second interconnection layer 68 and then solder 71 is formed on the ball bump using transferring techniques. If, at this point, good chips have been known as a result of probe testing, then the Au ball bump 70 has only to be formed on only the good chips. This will result in better yield and increased production efficiency.

Figure 24:
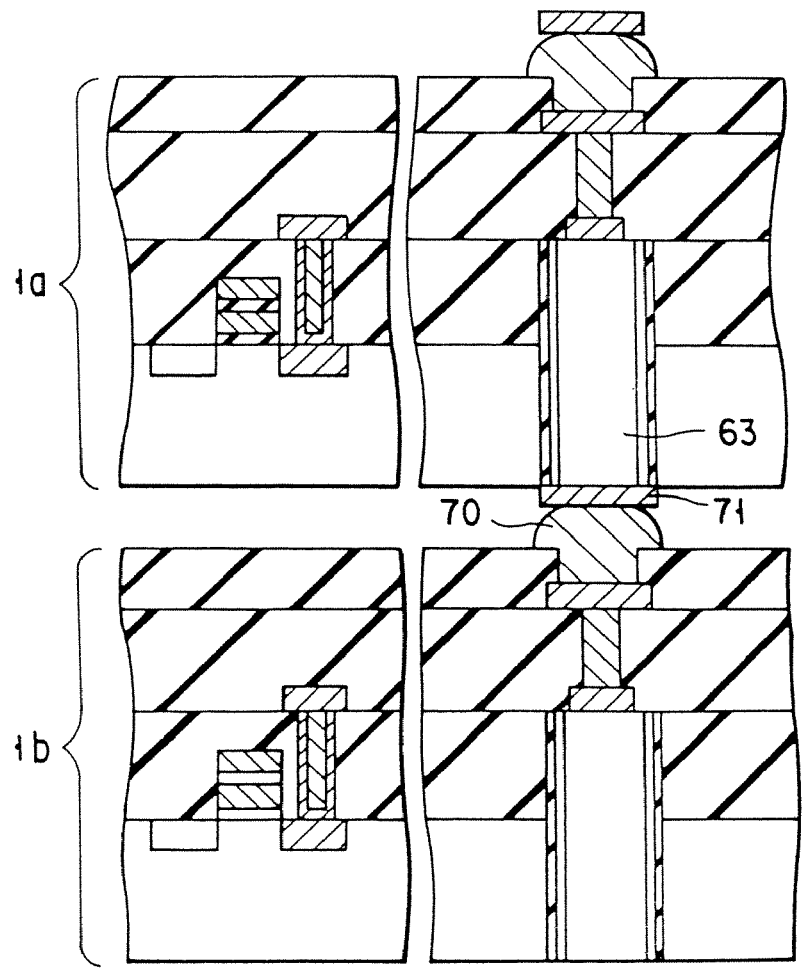
FIG. 24 is a sectional view illustrating a method of manufacturing a multichip semiconductor device according to an tenth embodiment of the present invention.

Finally, as shown in FIG. 24, the solder 71 (the Au ball bump 70) and the nickel film (metal plug) 63 are registered with each other and then brought into contact with each other to connect the silicon substrates 50 together, whereby an EEPROM multichip semiconductor device is completed. After that, its electrical characteristics are evaluated. If a defective chip is found, the solder 71 is heated to its melting point and the defective chip is then separated from a stack of chips. The defective chip is then replaced with a good one.

Although the present embodiment has been described in terms of a NAND type EEPROM multichip semiconductor device, a NOR type EEPROM multichip semiconductor device and a DRAM multichip semiconductor device can also be manufactured in the same way as in the present embodiment.

In addition, multichip semiconductor devices for information processing units, such as personal computers, can also be manufactured.

According to the present invention, as described above, a multichip semiconductor device can be provided which is small in plane area, simple in structure, and small in thickness. This is because at least one chip has a structure in which a connect plug of metal is formed in a hole that passes through its semiconductor substrate and interlayer insulating film and the chip is electrically connected with another chip by the connect plug.

Moreover, the present invention uses, as a chip in a multichip semiconductor device, a semiconductor substrate into which circuit components are manufactured and a connect plug of metal, formed in a through hole that passes through the semiconductor substrate and an interlayer insulating film formed on the substrate, for providing an electrical connection with another chip.

By the use of such a chip, a multichip semi-conductor device of the present invention is realized.

Furthermore, in the present invention, after the formation of a hole which passes through the interlayer insulating film but not the semiconductor substrate, the rear side of the substrate is processed to allow the hole to pass through the substrate. Thus, even if the original semiconductor substrate is thick, the through hole can be formed easily.

Accordingly, even if a semiconductor substrate is thick, a chip for a multichip semiconductor device of the present invention can be formed easily.

Eleventh Embodiment

FIG. 25 is a cross-sectional view showing a multichip semiconductor device according to an eleventh embodiment of the present invention.

The multichip semiconductor device is constructed such that two chips $101_1$ and $101_2$ are connected via an interlayer wiring substrate 109 formed of a ceramic material. The chip $101_1$, $101_2$ generally comprises a silicon substrate 102 on which devices are integrally formed, and a wiring multilayer 103 for connecting the devices in a predetermined relationship.

A pad 106 provided on the wiring multilayer 103 of chip $101_1$ is electrically connected to a pad 106 provided on the multilayer wiring substrate 109 through a solder bump 108. Another pad 106 electrically connected to this pad 106 and provided on the multilayer wiring substrate 109 is electrically connected to a pad 106 provided on the wiring multilayer 103 of chip $101_2$. The upper and lower chip $101_1$ and $101_2$ are electrically connected to each other through the multilayer wiring substrate 109 interposed therebetween.

A conductive through-plug 104 (conductive plug) penetrating the silicon substrate 102 is provided in the chip $101_2$. The though-plug 104 is electrically connected to the pad 106 of multilayer wiring substrate 109 through the pad 106 of chip $101_2$ and the bump 108 provided thereon.

The through-plug 104 is formed outside the device formation region. An insulating film 105 is provided between the through-plug 104 and silicon substrate 102 (through-hole). The insulating film 105 and through-plug 104 constitute a connect plug.

An insulating film 107 is coated on a silicon region, that is, a region except the through-plug 104, of the silicon substrate 102 of chip $101_2$, which is opposed to the wiring multilayer 103. The through-plug 104 has a heat-radiation facilitating effect.

Another means for facilitating heat radiation is to form the multilayer wiring substrate 109 of a material having a higher thermal conductivity than the chip $101_1$, $101_2$. Specifically, in the case of a Si chip, such an insulating material as SiC may be used. Alternatively, a metal plate may be buried, as will be described below in connection with a twelfth embodiment of the invention.

According to the present embodiment, since the chip $101_2$ is stacked on the chip $101_1$ with the multilayer wiring substrate 109 interposed, the area in plan of the device can be reduced, unlike the conventional multichip semiconductor device in which a plurality of chips are arranged in a plane.

According to the present embodiment, since the chip $101_2$ having the through-plug 104 electrically connected to the chip $101_1$ via the multilayer wiring substrate 109 is used, an inspection of the device can be performed by putting a test probe in contact with the through-plug 104. Since the through-plug 104 is exposed to the bottom face of the semiconductor substrate 102, the test probe can easily be put in contact with the through-plug 104. According to the present embodiment, therefore, the device can easily be inspected.

In this embodiment, the number of chips is set at one. However, since chips are interconnected via the multilayer wiring substrate 109 in this embodiment, the number of chips is not limited to two, unlike the conventional multichip semiconductor device wherein chips are connected in a face-to-face fashion.

Therefore, the present embodiment can provide a multichip semiconductor device with a small area in plan, which permits an easy inspection and does not limit the number of stacked chips to two.

The through-plug 104, though provided in the chip $101_2$ in the present embodiment, may be provided in the chip $101_1$ or in each of the chips $101_1$ and $101_2$.

12th Embodiment

FIG. 26 is a cross-sectional view showing a multichip semiconductor device according to a 12th embodiment of the present invention. FIG. 27 is a plan view of a connecting substrate of the multichip semiconductor device of FIG. 26.

This multichip semiconductor device is characterized in that two adjacent chips, i.e. upper and lower chips, are electrically connected via a connecting substrate having a through-plug and a heater.

Specifically, a pad 106 provided on a wiring multilayer 103 of a chip $101_1$ is connected to a through-plug 104 of a connecting substrate $131_1$ via a solder bump 108. The through-plug 104 of connecting substrate $131_1$ is connected to a through-plug 104 of a chip $101_2$ via another solder bump 108.

The adjacent upper and lower chips $101_1$ and $101_2$ are electrically connected via the through-plug 104 of the interposed connecting substrate $131_1$. Similarly, the chip $101_2$ is electrically connected to a chip $101_3$ via a through-plug 104 of a connecting substrate $131_2$. The through-plugs 104 are formed according to the methods of the twelfth embodiment.

The connecting substrates $131_1$ and $131_2$ are formed to have a thermal conductivity sufficiently higher than that of the chips $101_1$ to $101_3$.

Specifically, the connecting substrates $131_1$ and $131_2$ are formed of a material having a higher thermal conductivity than silicon, of which the silicon substrate 102 is formed, for example, an insulating material such as SiC. In the example shown, the connecting substrate $131_2$ is formed of an insulating material. Accordingly, no insulating film is formed on a side wall of the through-hole in which the through-plug 104 is buried.

A metal plate 132 having a higher thermal conductivity than the connecting substrate body (through-plug 104+connecting substrate $131_1$; through-plug 104+connecting substrate $131_2$) is buried in the connecting substrate body. The metal plate 132 is formed of, e.g. W, or Cu. The metal plate 132 may be provided on the surface of the connecting substrate $131_1$, $131_2$, or both in the connecting substrate $131_1$, $131_2$ and on the surface of the connecting substrate $131_1$, $131_2$.

Heaters 133 are buried in upper and lower surface portions of the connecting substrate $131_1$, $131_2$ so as to surround the vicinities of the solder bumps 8. The heaters 133 are connected to an external power supply over power lines 134 of W, etc. provided on the connecting substrate $131_1$, $131_2$.

The power lines 134 can be controlled independently. Accordingly the four heaters 133, i.e. two heaters 133 buried in the upper and lower surfaces of the connecting substrate $131_1$ and two heaters 133 buried in the upper and lower surfaces of the connecting substrate $131_2$, can be controlled independently. Each power line 134 constitutes a capacitor for ensuring stable supply of power.

In FIG. 26, reference numeral 35 denotes a wiring substrate, and 36 a wiring multilayer. A connecting substrate $131_3$ is similar to the connecting substrate $131_1$, $131_2$, but it is not used for interconnecting chips. The connecting substrate $131_3$ is used as a heat radiating plate, but it may not necessarily be provided. In addition, an insulating film on the side wall of the through-hole in the semiconductor substrate is omitted.

In the present embodiment, the connecting substrate $131_1$, $131_2$ has a sufficiently higher thermal conductivity than the chip, $101_1$ to $101_3$. Even if the chips $101_1$ to $101_3$ produce heat in operation, the heat can be efficiently radiated to the outside through the connecting substrates $131_1$ to $131_3$. Thereby, deterioration in operational characteristics of the chips $101_1$ to $101_3$ and a decrease in life of the chips $101_1$ to $101_3$ due to the produced heat can be prevented.

According to the present embodiment, the independently operable heaters 133 provided on the connecting substrates $131_1$ and $131_2$, are operated to selectively melt only the bumps connected to a chip determined to be defective by inspection. Thus the defective chip alone can be selectively separated from the connecting substrate. Therefore, repairs to the chip can easily be made.

FIGS. 28A and 28B show how to make repairs. In these figures, only reference numerals necessary for descriptions are added. The structure of the multichip semiconductor device is the same as that shown in FIG. 26 (the same applicable to the other embodiments).

FIG. 28A shows a state in which the chip is inspected by test probes. FIG. 28B shows a state in which the chip $101_2$, which has been determined to be defective by the inspection, and the connecting substrate $131_2$ connected thereto, are moved. In the step in FIG. 28B, the chip $101_2$ and the connecting substrate $131_1$ connected thereto may be removed.

Subsequently, the chip $101_2$ is separated from the connecting substrate $131_2$, and a new chip is connected to the connecting substrate $131_2$. Then the connecting substrate $131_2$ with the new chip is restored and connected as in the previous state. If the new chip is inspected and it has passed the inspection, repairs are completed. If the chip fails to pass the inspection, the present step is repeated until it passes the inspection.

In the present embodiment, the heaters 133 are formed to surround the vicinities of the solder bumps 8, and the vicinities of solder bumps 108 are preferentially heated. However, even if the heaters 133 are provided to heat the entire connecting substrate, repairs can be made more easily than in the prior art.

13th Embodiment

FIG. 29 is a cross-sectional view showing a multichip semiconductor device according to a 13th embodiment of the present invention.

The 13th embodiment differs from the 12th embodiment in that the connecting substrates $131_1$ to $131_3$ are provided with a heat radiation fin 137. The radiation fin 137 is fixed to the connecting substrates $131_1$ to $131_3$ by means of, e.g. an adhesive. It may be fixed by other means such as metallization.

According to this embodiment, heat is radiated not only through the connecting substrates $131_1$ to $131_3$ but also through the radiation fin 137 with a higher thermal conductivity. Therefore, heat can be efficiently radiated from the chips $101_1$ to $101_3$.

14th Embodiment

FIG. 30 is a cross-sectional view showing a multichip semiconductor device according to a 14th embodiment of the invention.

The 14th embodiment differs from the 13th embodiment in that a radiation fin 137 is provided only on the chip which produces a great amount of heat. In this embodiment, it is assumed that the amount of heat produced by the chip $101_2$, $101_3$ is greater than that produced by the chip $101_1$. In this case, there is no need to provide the chip $101_3$ with the connecting substrate $131_3$ serving as a radiation plate and the dimension of the device in the direction of stacking of chips can be reduced.

15th Embodiment

Figure 31:
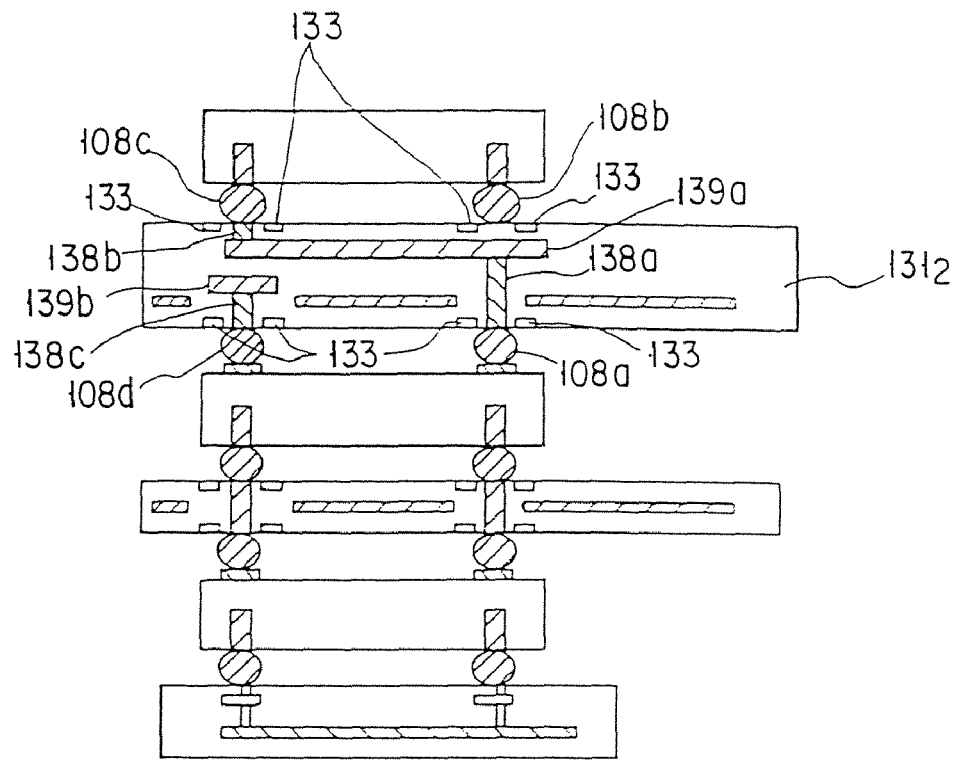
FIG. 31 is a sectional view of a multichip semiconductor device according to a 15th embodiment of the present invention.

FIG. 31 is a cross-sectional view showing a multichip semiconductor device according to a 15th embodiment of the invention.

The 15th embodiment differs from the 12th embodiment in that a wiring multilayer is provided within the connecting substrate $131_2$ and wiring is rearranged. Specifically, the solder bump 108a is not connected to the solder bump 108b provided over the solder bump 108a, but to the solder bump 108c, which is provided in an inclined upward direction of the solder bump 108a, via a plug 138a, a wiring layer 139a and a plug 138b. On the other hand, the solder bump 108d is not connected to the solder bump 108c but to a wiring layer 139b via a plug 138c.

The heaters 133 are buried in the upper and lower surface portions of the connecting substrate $131_2$ at a distance from the wiring layers 139a and 139b. However, the heaters 133 may be provided within the connecting substrate $131_2$ in the same layer as the wiring layers 139a and 139b.

16th Embodiment

Figure 32:
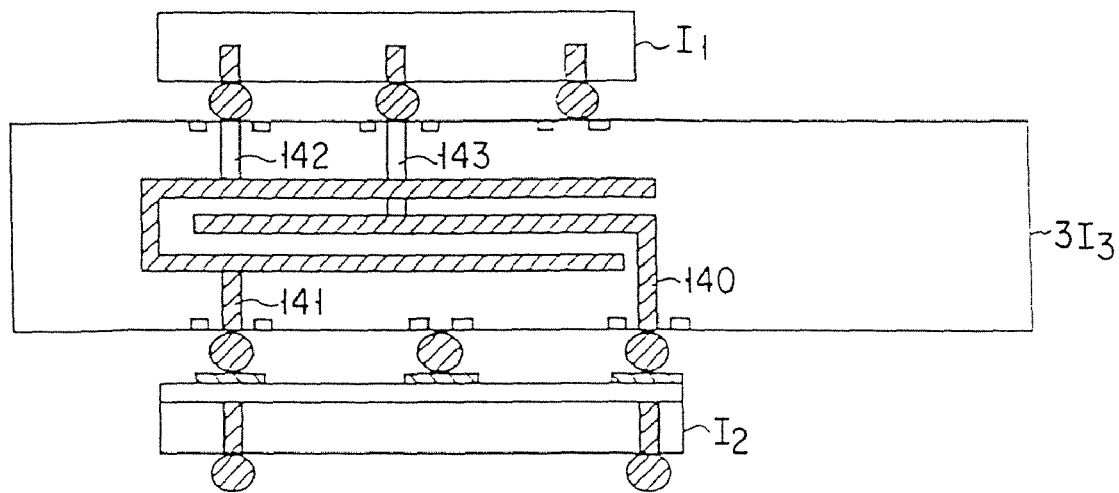
FIG. 32 is a sectional view of a multichip semiconductor device according to a 16th embodiment of the present invention.

FIG. 32 is a cross-sectional view showing a multichip semiconductor device according to a 16th embodiment of the invention.

This embodiment differs from the 12th embodiment in that capacitors are provided within the connecting substrate to stabilize power supply to the chips. Referring to the connecting substrate $131_3$, a power line 140 and a ground line 141 are formed within the connecting substrate $131_3$ such that the ground line 141 extends above and below the power line 140. Thereby, two series-connected capacitors are vertically provided.

The material of the connecting substrate $131_3$ is an insulating material. Reference numerals 142 and 143 denote wiring elements. Although the wiring elements 142 and 143 are connected to the bumps via pads, such pads are not shown. Similar capacitors are formed in connecting substrates (not shown) other than the connecting substrate $131_3$. Note that capacitors or an active element for stabilization of the power source and for amplifying a signal may be formed on the connecting substrate instead of that the capacitors are formed within the connecting substrate.

17th Embodiment

FIG. 33 is a cross-sectional view showing a multichip semiconductor device according to an 17th embodiment of the invention.

In the multichip semiconductor device of this embodiment, an upper-layer Si chip $151_1$ is connected to lower-layer Si chips $151_2$ and $151_3$ via multilayer wiring substrates $152_1$ and $152_2$ formed of Si. Reference numeral 50 denotes device formation surfaces of the Si chips $151_1$ to $151_3$.

Pads 153 provided on the Si chip $151_1$ are connected via solder bumps 154 to pads 155 provided on the multilayer wiring substrate 152*j*. The pads 155 are connected to pads 158 provided on the multilayer wiring substrate $152_2$, via a wiring layer (not shown) formed on the multilayer wiring substrate $152_1$, through-plugs 104 connected to the wiring layer, pads 156 provided on the multilayer wiring substrate $152_1$ and bumps solder 157. The through-plugs 104 and the wiring layer are normally formed of a metal such as Cu or Al in order to fully exhibit their functional properties. However, if it is important to equalize thermal expansivities, they may be formed of Si films with high impurity concentration.

The Pads 158 are connected to pads 161 provided on the Si chips $151_2$ and $151_3$, via a wiring layer (not shown) formed on the multilayer wiring substrate $152_2$, pads 159 connected to the wiring layer, and solder bumps 160. This wiring layer is formed of a metallic material or an Si film with high impurity concentration, as mentioned above.

In this manner, the upper-layer Si chip $151_1$ is connected to the lower-layer Si chips $151_2$ and $151_3$ via the multilayer wiring substrates $152_1$ and $152_2$.

The multilayer wiring substrate $152_1$ is connected to the multilayer wiring substrate $152_2$ via the pads 156, solder bumps 157 and pads 158. Similarly, the multilayer wiring substrate $152_2$ is connected to a plastic substrate 165 via pads 162, solder bumps 163 and pads 164. The plastic substrate 165 is provided with pads 166 and solder bumps 167. Wiring layers 168 for connecting the pads 164 and 166 are formed within the plastic substrate 165.

An adhesive 169 including no filler is filled between the Si chip $151_1$ and wiring substrate $152_1$ and between the Si chips $151_2$ and $151_3$ and multilayer wiring substrate $152_2$.

Even if the adhesive 169 includes no filler, the Si chips $151_1$ to $151_3$ and the multilayer wiring substrates $152_1$ and $152_2$ are formed of the same Si. Accordingly, the thermal expansivity of the Si chips $151_1$ to $151_3$ is equal to that of the multilayer wiring substrates $152_1$ and $152_2$. Therefore, highly reliable connection is achieved.

On the other hand, since the multilayer wiring substrate $152_2$ and plastic substrate 165 are formed of different materials, an adhesive 170 including a filler is filled between the wiring substrate $152_2$ and plastic substrate 165, thereby ensuring reliable connection therebetween.

Since no devices are formed on the multilayer wiring substrates $152_1$ and $152_2$, the pitch of solder bumps 163 can be set at a desired value. The pitch of solder bumps 163 may be set at such a value that the adhesive 170 can be surely put among the solder bumps 163.

As has been described above, in the present embodiment, since the multilayer wiring substrates $152_1$ and $152_2$ and Si chips $151_1$ to $151_3$ are formed of the same Si, thermal strain hardly occurs in the solder bumps 154 and 160.

Accordingly, even if the integration density of the Si chips $151_1$ to $151_3$ further increases and the distance between the Si chip $151_1$ and multilayer wiring substrate $152_1$, as well as between the Si chips $151_2$ and $151_3$ and multilayer wiring substrate $152_2$, further decreases, the reliable connection therebetween is ensured. Accordingly, reliable connection between the upper-layer Si chip $151_1$ and the lower-layer Si chips $151_2$ and $151_3$ is ensured.

Since the multilayer wiring substrates $152_1$ and $152_2$ and Si chips $151_1$ to $151_3$ are formed of the same Si, there is no need to make their thermal strains close to each other, and the adhesive 169 including no filler can be used.

Accordingly, even if the integration density of the Si chips $151_1$ to $151_3$ further increases and the distance between the Si chip $151_1$ and multilayer wiring substrate $152_1$, as well as between the Si chips $151_2$ and $151_3$ and multilayer wiring substrate $152_2$, further decreases, there occurs no region which is not filled with the adhesive 169. Therefore, reliable connection between the upper-layer Si chip $151_1$ and the lower-layer Si chips $151_2$ and $151_3$ is ensured.

The area in plan of the device can be reduced for the same reason as described with respect to the eleventh embodiment.

In the present embodiment, since there is no need to form through-plugs in the Si chips $151_1$ to $151_3$ on which devices are formed, a rise in manufacturing cost can be suppressed. Needless to say, it is possible to connect the Si chip $151_1$ to the Si chips $151_2$ and $151_3$ via the multichip wiring substrate $152_1$ by using the Si chips Si chips $151_1$ to $151_3$ having through-plugs.

FIGS. 40A to 40H are cross-sectional views illustrating the steps of a method of manufacturing the multichip semiconductor device according to the present embodiment.

To start with, as shown in FIG. 34A devices (not shown) are integrally formed on the device formation surface 150 of the Si substrate. The pads 153 are then formed to constitute the Si chip $151_1$. The solder bumps 154 are then formed on the pads 153.

As is shown in FIG. 34B, the through-plugs 104 of Si, wiring layer and pads 155 are formed on the Si substrate, thus constituting the multilayer wiring substrate $152_1$. The pads 155 are formed at positions corresponding to the pads 153. Each of pads 153 and 155 has a square shape with each of 20 μm. The pitch of the pads 153 and 155 is set at 30 μm (the distance between adjacent pads is 10 μm).

In a step shown in FIG. 34C, the solder bumps 154 of Si chip $151_1$ are aligned with the pads 155 of multilayer wiring substrate $152_1$, and these are bonded to each other. The epoxy adhesive 169 including no filler is filled between the Si chip $151_1$ and multilayer wiring substrate $152_1$. Thus, a unit $171_1$ wherein the Si chip $151_1$ is bonded by flip-chip bonding to the multilayer wiring substrate $152_1$ is formed.

The distance between the Si substrate constituting the multilayer wiring substrate $152_1$ and the Si substrate constituting the Si chip $151_1$ is set at 20 μm. Accordingly, the size of each solder bump 154 is set at about 20 μmϕ.

As is shown in FIG. 34D, devices (not shown) are integrally formed on the device formation surface 150 of the Si substrate. The pads 161 are then formed to constitute the Si chip $151_2$. The solder bumps 160 are then formed on the pads 161 of Si chip $151_2$. Similarly, the Si chip $151_3$ is formed and the solder bumps 160 are formed on the pads 161 of Si chip $151_3$.

As is shown in FIG. 34E, the through-plugs 104 of Si, wiring layer and pads 158, 159 and 162 are formed on the Si substrate, thus constituting the multilayer wiring substrate $152_2$. The solder bumps 157 are formed on the pads 158.

As is shown in FIG. 34F, like the unit $171_1$, alignment, bonding and filling of adhesive 169 are carried out, and a unit $171_2$ wherein the Si chip $151_2$ and Si chip $151_3$ are bonded by flip-chip bonding to the multilayer wiring substrate $152_2$ is formed.

Subsequently, as shown in FIG. 34G, the solder bumps 157 and pads 156 are bonded and thus the units $171_1$ and $171_2$ are connected.

Since the multilayer wiring substrates $152_1$ and $152_2$ and Si chips $151_2$ and $151_3$ are formed of Si, no thermal strain occurs due to a difference in thermal expansivity. Accordingly, the size and pitch of bumps may be determined by considering only the thickness of the Si chip $151_2$, $151_3$ between the multilayer wiring substrates 152₁ and 152₂, without considering thermal strain due to a difference in thermal expansivity.

Since the pads 162 formed on the lower surface of the multilayer wiring substrate 152₂ are to be connected to the solder bumps 163 of plastic substrate 165, it is necessary that the diameter of each pad 162 and the pitch of pads 162 be set at about 100 μm or more and at about 200 μm or more, respectively. A wiring layer for relaxing the pitch is formed on the multilayer wiring substrate 152₂.

At last, as shown in FIG. 34H, the plastic substrate 165 having pads 164 and 166 and wiring layer 168 is formed. The solder bumps 163 and 167 are formed on the pads 64 and 66, respectively. The unit 171₂, to which the unit 171₁ is connected is aligned with, and connected to, the plastic substrate 165. In order to relax strain, the adhesive 170 including filler of $SiO_2$ is filled between the plastic substrate 165 and unit 171₂. Thus, the multichip semiconductor device shown in FIG. 33 is obtained.

In the present embodiment, Si substrates are used for the multilayer wiring substrates 152₁ and 152₂. Accordingly, inexpensive, uniform multilayer substrates 152₁ and 152₂ can be formed by mass production.

The design rules for the wiring layers, which constitute the multilayer wiring substrates 152₁ and 152₂, are much more relaxed than those for the wiring layers which constitute the Si chips 151₁ and 151₂ (e.g. on the order of several μm). Accordingly, a yield of nearly 100% can be achieved. Moreover, since there is no need to form devices such as MOS transistors or capacitors, there is no need to consider contamination on Si substrates, and the manufacturing process can be simplified.

In the present embodiment, it is assumed that the material of the chips is the same as that of the multilayer wiring substrates. However, these materials may differ if their thermal expansivities are nearly equal. In this case, it is preferable to use such a combination of materials that the radiation properties of the multilayer wiring substrate (connecting substrate) become higher than those of the chip.

Besides, where the same material is used, it is preferable to form the through-plugs of a material having higher radiation properties than the material of, e.g. the multilayer wiring substrate, by providing the multilayer wiring substrate with radiation means such as a radiation fin or by providing the through-plugs in the multilayer wiring substrate with radiation functions. Specifically, it is understood from a table of FIG. 35 that SiC or AlN can be used if the material of the chips and multilayer wiring substrates is Si.

As has been described above in detail, according to the present invention, since a plurality of chips are stacked, the area in plan of the device can be reduced. Moreover, the chip in which conductive plugs is formed may be situated at the top or bottom of the device and thus the test probes can easily be put in contact with the conductive plugs. Therefore, inspections of the device can easily be performed.

According to the present invention, since a plurality of chips are stacked, the area in plan of the device can be reduced. In addition, since the heat radiation properties of the connecting substrate are higher than those of the chips, the radiation properties of the device can be improved.

According to the present invention, since a plurality of chips are stacked, the area in plan of the device can be reduced. In addition, since bumps connected to a defective chip can be melted by heater units of the connecting substrate, repairs of the chip can easily be made.

According to the invention, since a plurality of chips are stacked, the area in plan of the device can be reduced. In addition, since the thermal expansivity of the material of the connecting substrate is nearly equal to that of the material of the semiconductor substrate, reliable connection between the chips is ensured even if the bumps and adhesive are used for connection members.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A chip for use in a multichip semiconductor device comprising:
    a semiconductor substrate having a surface on which circuit components are formed;
    a first interlayer insulating film formed above the surface of the semiconductor substrate;
    a connect plug made of a metal and formed in a through hole that passes through the first interlayer insulating film and the semiconductor substrate;
    a second interlayer insulating film formed on the first interlayer insulating film; and
    a metal interconnection which passes through the second interlayer insulating film and which connects to a portion of the connect plug, an area of the portion being smaller than a cross-sectional area of the connect plug,
    wherein the connect plug includes a metal plug formed in the through hole and having a cavity, an insulating film formed between the metal plug and a sidewall of the through hole, and a film formed in the cavity, the film being smaller than the metal plug in a difference in thermal expansion coefficient from the semiconductor substrate.

2. The chip for use in a multichip semiconductor device according to claim 1, further comprising:
    a bump which electrically connects the connect plug to the another chip with a predetermined space.

3. A chip for use in a multichip semiconductor device comprising:
    a semiconductor substrate having a surface on which circuit components are formed;
    a first interlayer insulating film formed above the surface of the semiconductor substrate; and
    a connect plug made of a metal and formed in a through hole that passes through the first interlayer insulating film and the semiconductor substrate;
    a second interlayer insulating film formed on the first interlayer insulating film; and
    a metal interconnection which passes through the second interlayer insulating film and which connects to a portion of the connect plug, an area of the portion being smaller than a cross-sectional area of the connect plug,
    wherein the connect plug includes a metal plug formed in the through hole so that a space is left in the through hole on a rear side of the semiconductor substrate, and an insulating film formed between the metal plug and a sidewall of the through hole, and a connect member to be electrically connected to another chip is formed in the space in the through hole.

4. The chip according to claim 1, further comprising a bump electrically connecting the connect plug to another chip with a predetermined space.

5. The chip according to claim 3, further comprising a bump electrically connecting the connect plug to another chip with a predetermined space.

* * * * *